(12) United States Patent
Klein et al.

(10) Patent No.: US 11,569,596 B2
(45) Date of Patent: Jan. 31, 2023

(54) PRESSURE FEATURES TO ALTER THE SHAPE OF A SOCKET

(71) Applicant: Intel Corporation, Santa Clara, CA (US)

(72) Inventors: Steven A. Klein, Chandler, AZ (US); Kuang Liu, Queen Creek, AZ (US); Srikant Nekkanty, Chandler, AZ (US); Feroz Mohammad, Chandler, AZ (US); Donald Tiendung Tran, Phoenix, AZ (US); Srinivasa Aravamudhan, Beaverton, OR (US); Hemant Mahesh Shah, Hillsboro, OR (US); Alexander W. Huettis, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 16/833,221

(22) Filed: Mar. 27, 2020

(65) Prior Publication Data
US 2021/0305731 A1    Sep. 30, 2021

(51) Int. Cl.
*H01R 12/00* (2006.01)
*H01R 12/70* (2011.01)
*H01R 43/04* (2006.01)

(52) U.S. Cl.
CPC ..... *H01R 12/7064* (2013.01); *H01R 12/7023* (2013.01); *H01R 43/04* (2013.01)

(58) Field of Classification Search
CPC ............... H05K 7/1069; H05K 7/1053; H01R 23/7073; H01R 12/57; H01R 13/518; H01R 13/2421
USPC ................ 439/71, 331, 79, 83, 540.1, 841.5
See application file for complete search history.

(56) References Cited

U.S. PATENT DOCUMENTS

| 7,722,376 B2 * | 5/2010 | Kobayashi | ........... | G01R 1/0466 |
| | | | | 439/70 |
| 2018/0013220 A1 * | 1/2018 | Haensgen | ............ | H01R 4/2433 |

* cited by examiner

*Primary Examiner* — Phuong Chi Thi Nguyen
(74) *Attorney, Agent, or Firm* — Schwabe, Williamson & Wyatt, P.C.

(57) ABSTRACT

Systems, apparatus, and/or processes directed to applying pressure to a socket to alter a shape of the socket to improve a connection between the socket and a substrate, printed circuit board, or other component. The socket may receive one or more chips, may be an interconnect, or may be some other structure that is part of a package. The shape of the socket may be flattened so that a side of the socket may form a high-quality physical and electrical coupling with the substrate.

17 Claims, 20 Drawing Sheets

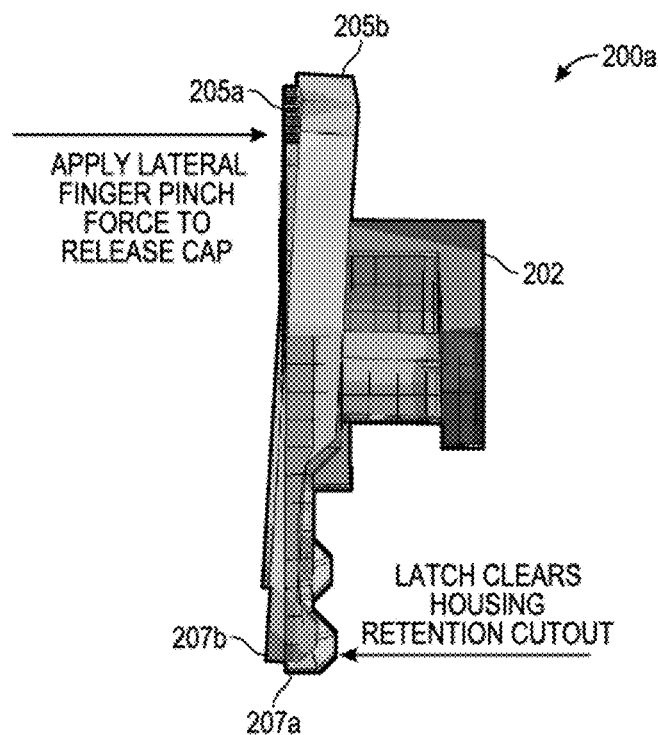
FIG. 2A
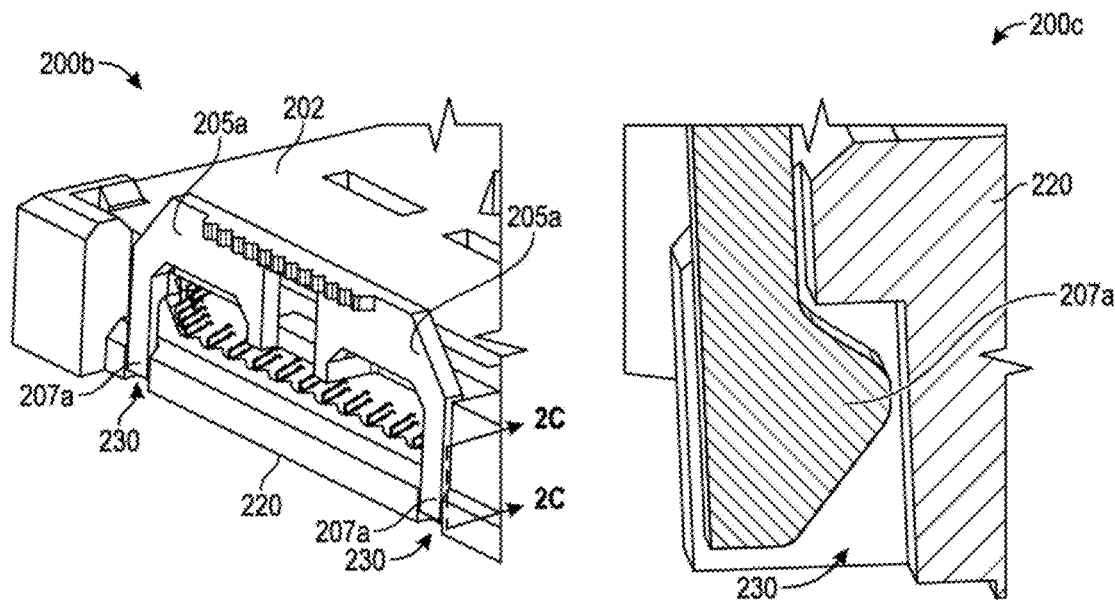
FIG. 2B  FIG. 2C

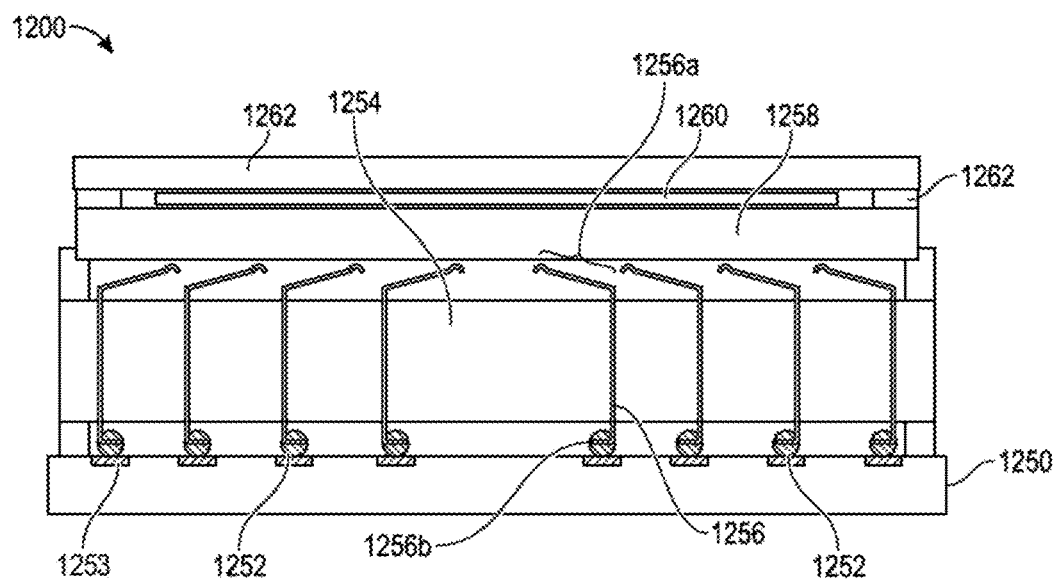
FIG. 12
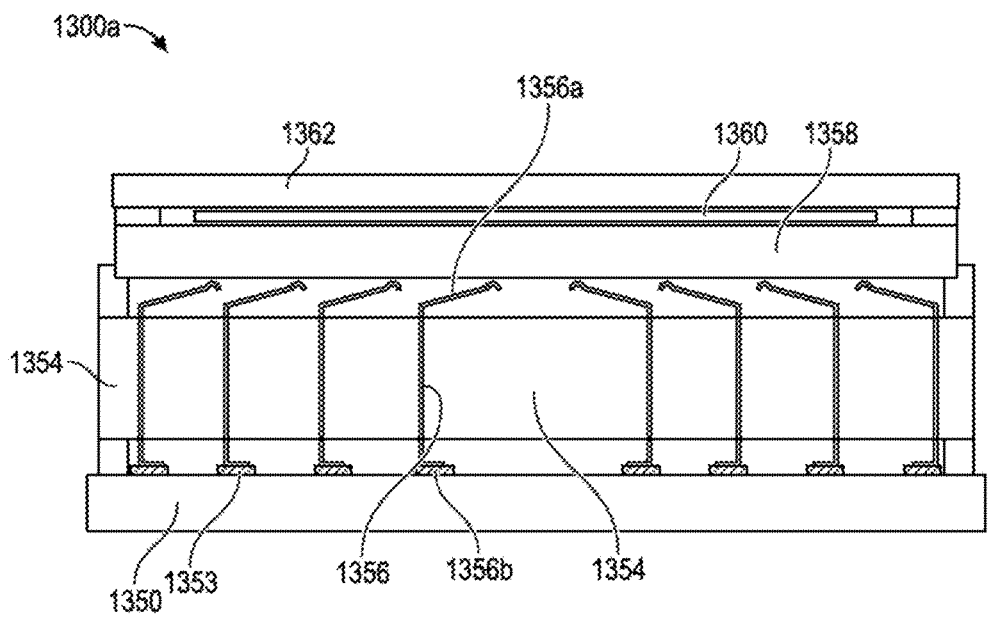
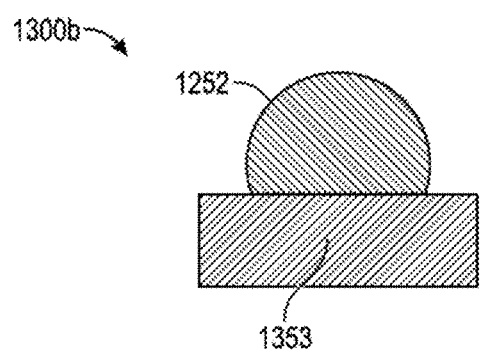
FIG. 13

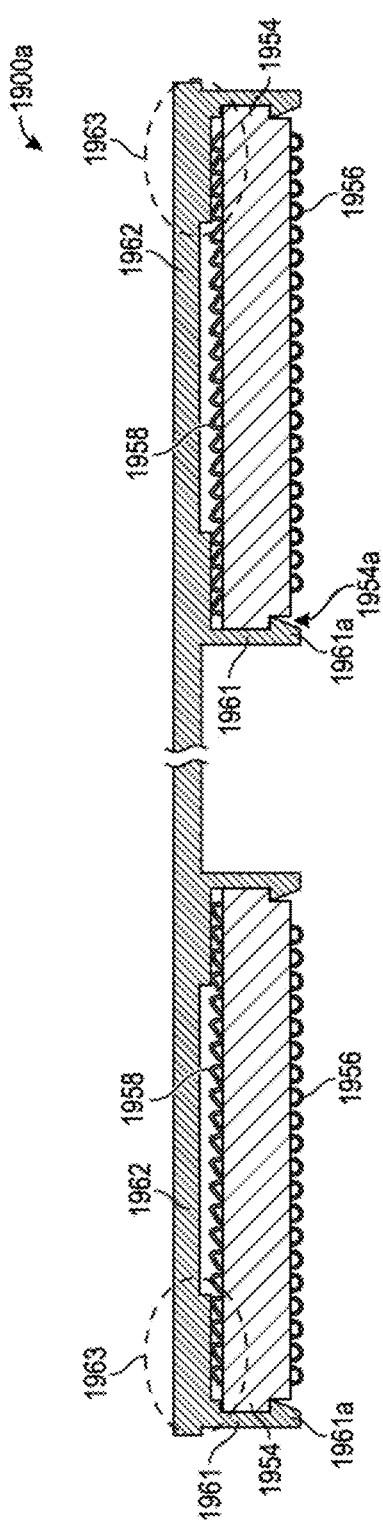
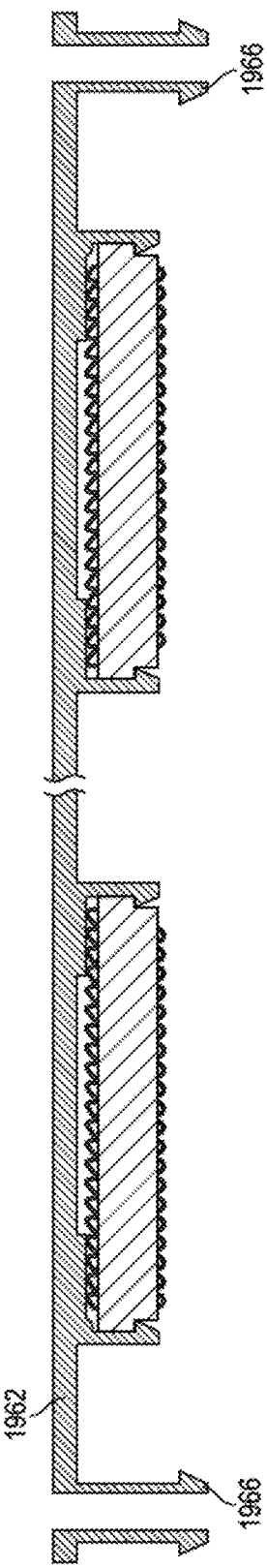
FIG. 19A
FIG. 19B

PRESSURE FEATURES TO ALTER THE SHAPE OF A SOCKET

FIELD

Embodiments of the present disclosure generally relate to the field of package assemblies, and in particular package assemblies with sockets coupled to substrates.

BACKGROUND

Continued reduction in end product size of mobile electronic devices such as smart phones and ultrabooks is a driving force for the development of reduced size system in package components.

BRIEF DESCRIPTION OF THE DRAWINGS

FIGS. 2A-2C illustrate examples of a latch to secure a PnP cap to a socket, in accordance with embodiments.

FIG. 12 illustrates an example of a package coupled with a motherboard using solder balls.

FIG. 13 illustrates an example of a package coupled with the motherboard using pads in the substrate, in accordance with embodiments.

FIG. 19A-19D illustrate a set of actions for using a carrier frame to house multiple independent socket segments, in accordance with embodiments.

DETAILED DESCRIPTION

Figure 1A:
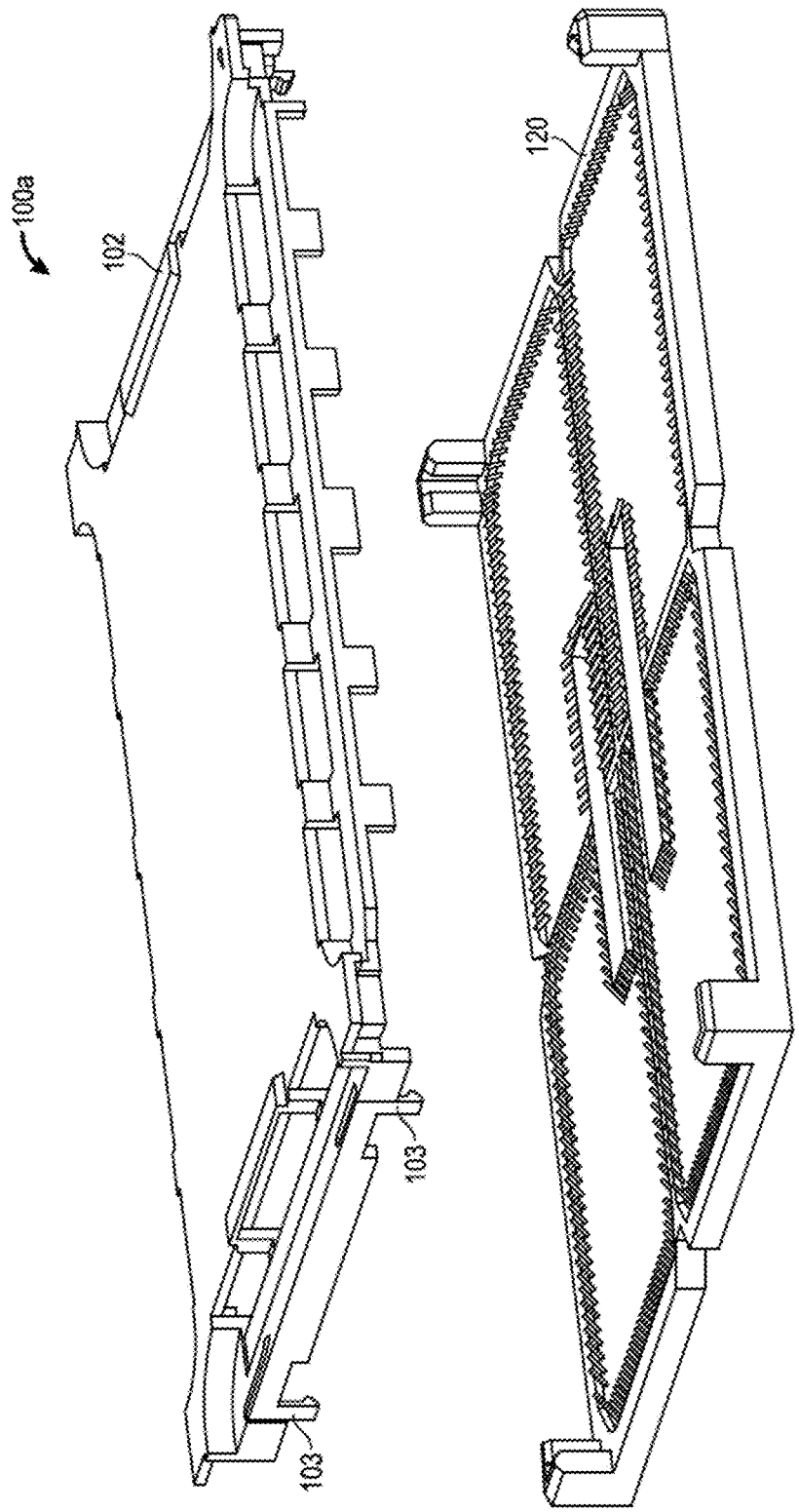
FIGS. 1A-1B illustrate examples of a socket and a pick and place (PnP) cap, in accordance with embodiments.

Embodiments of the present disclosure may generally relate to systems, apparatus, and/or processes directed to applying pressure to a socket to alter a shape of the socket to improve a connection between the socket and a printed circuit board. In embodiments, the socket may be a socket to receive one or more chips, may be an interconnect, or may be some other structure that is part of a package. In embodiments, the socket is to be coupled with another component, which may include a substrate. In embodiments, the socket may be flattened so that a side of the socket may form a higher-quality physical and electrical coupling with the substrate or other component. In embodiments, the flattened socket may be applied to a substrate using a surface mounted socket on a printed circuit board or other socket connector design.

In legacy implementations, SMT yield using a land grid array (LGA) or ball grid array (BGA) sockets, or other legacy interconnects may have issues with warpage. This may be particularly true with sockets of a large size, in one non-limiting example sockets having a dimension of 60 mm×60 mm or greater. Socket warpage may make it difficult to form a quality electrical and physical coupling between the socket and the substrate or other component. To overcome this, techniques described herein may be directed to reforming, reshaping, or altering the shape of a socket. In some embodiments described herein, solder balls for physical and electrical coupling with a straight may be eliminated, where only solder paste to be used for surface mount. These implementations may have the advantage of higher quality, higher-speed signaling, and lower overall cost.

A first set of embodiments may be directed to PnP cap design to shape a socket to control warpage both during and after SMT by including springs embedded within the cap to put mechanical pressure on various locations of the socket to shape or flatten the socket. A second set of embodiments may be directed to applying a weight load to the socket to shape the socket. In embodiments, the weight may be applied to standoffs that are part of the socket. A third set of embodiments may be directed to using a fixture, for example a carrier frame, to constrain the shape of the socket during SMT to prevent socket warpage.

Embodiments described herein may improve the socket to substrate connection to an LGA pad on the substrate after the socket is soldered to the substrate. In embodiments, In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1B:
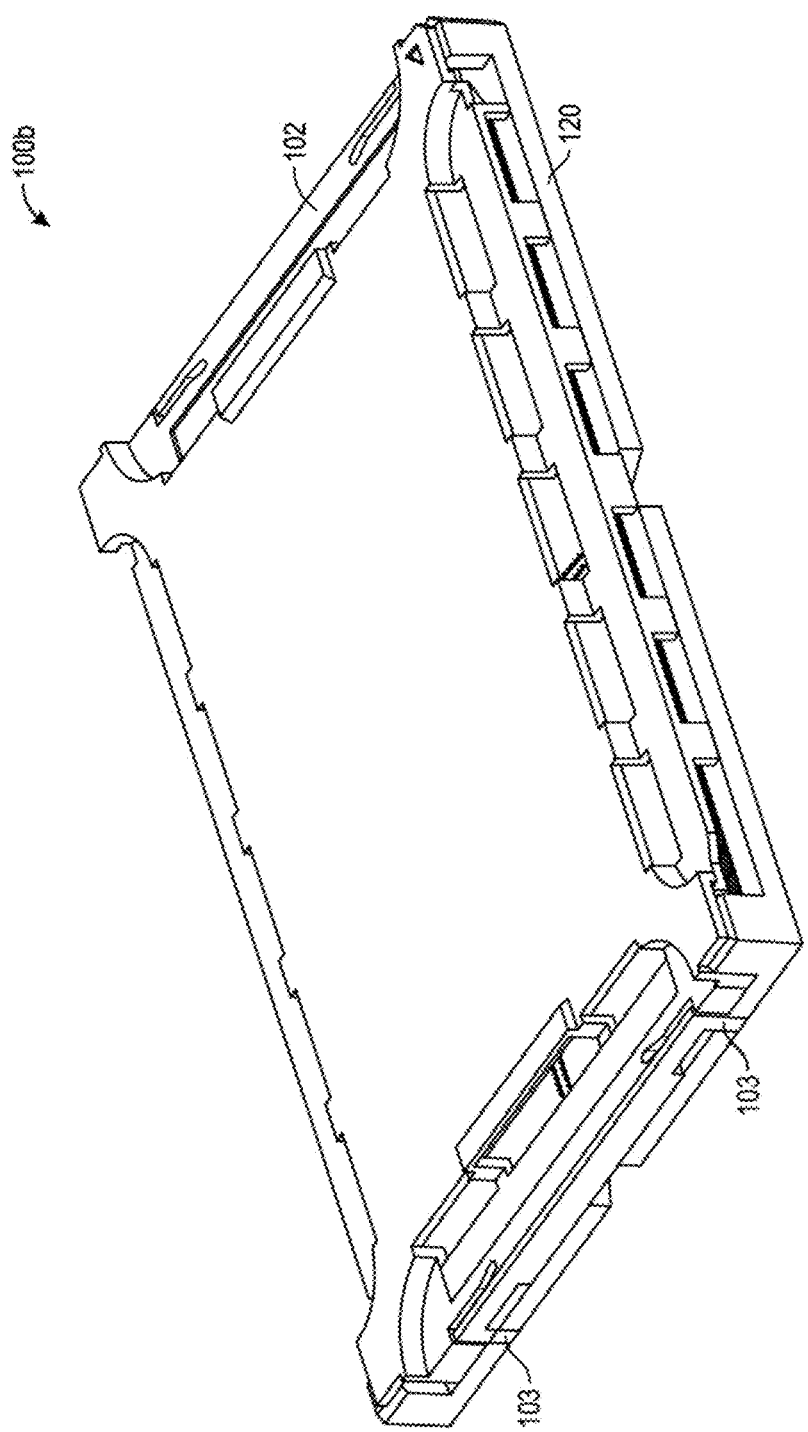

FIGS. 1A-1B illustrate examples of a socket and a PnP cap, in accordance with embodiments. Diagram 100a of FIG. 1A shows a cap 102 that may be applied to a socket 120. In embodiments, the cap 102 may be a PnP cap used during manufacture. The cap 102 may be used to protect socket 120 contacts, and may be used during manufacture to pick a socket 120 for subsequent placement on a substrate. As shown, the cap 102 may have various features, ridges, and patterns to provide rigidity to the cap 102. In embodiments, latches 103 may exist on the cap to secure it to the socket 120. Diagram 100b of FIG. 1B shows the cap 102 and the socket 120 joined together, with latches 103 securing the cap 102 to the frame of the socket 120. In legacy implementations, the latches 103 may couple with the socket 120 in a secure enough fashion to pick up the socket 120 during a manufacturing process, but may not be strong enough to prevent the socket 120 from being pried away from the cap 102. In embodiments the cap may be designed with sufficient airflow to allow SMT.

FIGS. 2A-2C illustrate examples of a latch to secure a PnP cap to a socket, in accordance with embodiments. A diagram of a latch 200a of FIG. 2A shows two positions of a latch, which may be similar to latch 103 of FIG. 1A. The latch 200a may be in an engaged or vertical position with upper latch position 205a and lower latch position 207a substantially vertical and engaged within space 230 as shown in diagram 200c of FIG. 2C. In this position, the lower latch position 207a will lock against the socket 220, which may be similar to socket 120 of FIG. 1A. This will secure the cap 202, which may be similar to cap 102 of FIG. 1A to the socket 220.

The latch 200a may be in an opened or disengaged position, with upper latch position 205b tilted away from vertical, for example by a finger pinch or some other tool, and lower latch portion 207b pulled away and out of space 230 to release the latch 200a from the socket 220. Diagram 200b shows a detail of two latches securing a cap 202 to a socket 220, with each portion of the latch 205a, 207a in a locked position. Embodiments shown with respect to FIGS. 2A-2C may be used for latching to a cap 102 to a socket 120 of FIG. 1B. The latch has a clearance fit, as shown with respect to FIG. 2C, for ease of removal post SMT. This design, along with the cap 202, is used to prevent pin damage and also pick and place a socket 220 onto a substrate during SMT. In embodiments, the latch design is shown in FIGS. 2A-2C may be sufficient to hold the weight of the socket 220 during PNP with a vacuum nozzle, but may not on their own apply any vertical force to constrain the socket 220 to alter its shape.

Figure 3:
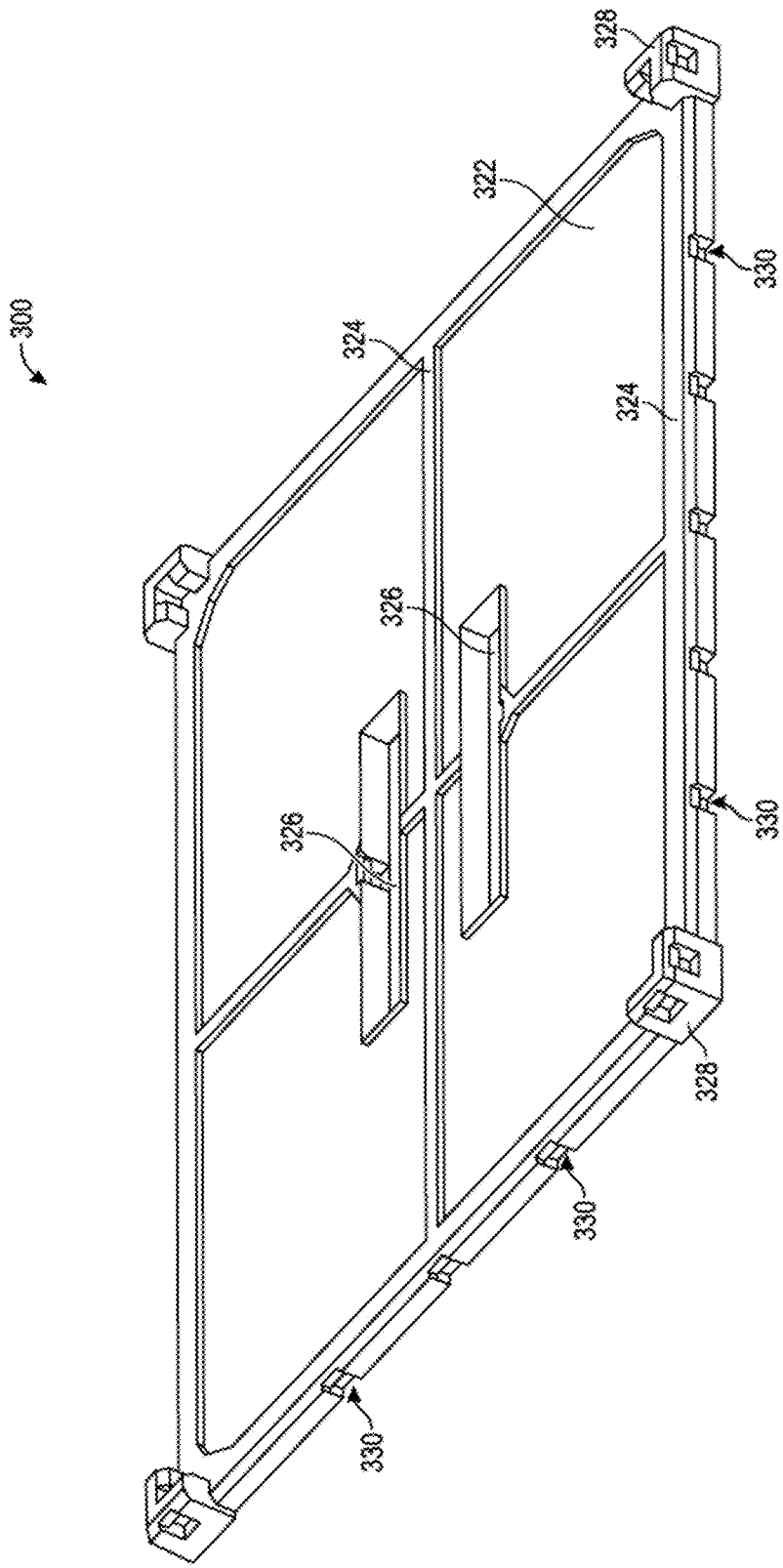
FIG. 3 illustrates an example socket housing that includes latch retention cutouts, in accordance with embodiments.

FIG. 3 illustrates an example socket housing that includes latch retention cutouts, in accordance with embodiments. Diagram 300 shows an example socket with a plurality of spaces 330, which may be similar to space 230 of FIG. 2C, to which lower portions of latches in position, such as lower latch position 207a, can engage with the socket. Other features of the socket 300 may also include, but are not limited to, features such as holes 326, and areas 322 to which chips may be applied, standoff features 324, discussed further below, to provide rigidity to the socket 300, and corner features 328 that may be used for mounting. In embodiments, a socket housing may be referred to as a subset of a socket 300, were various pins and/or solder balls are not included in the socket housing.

Figure 4:
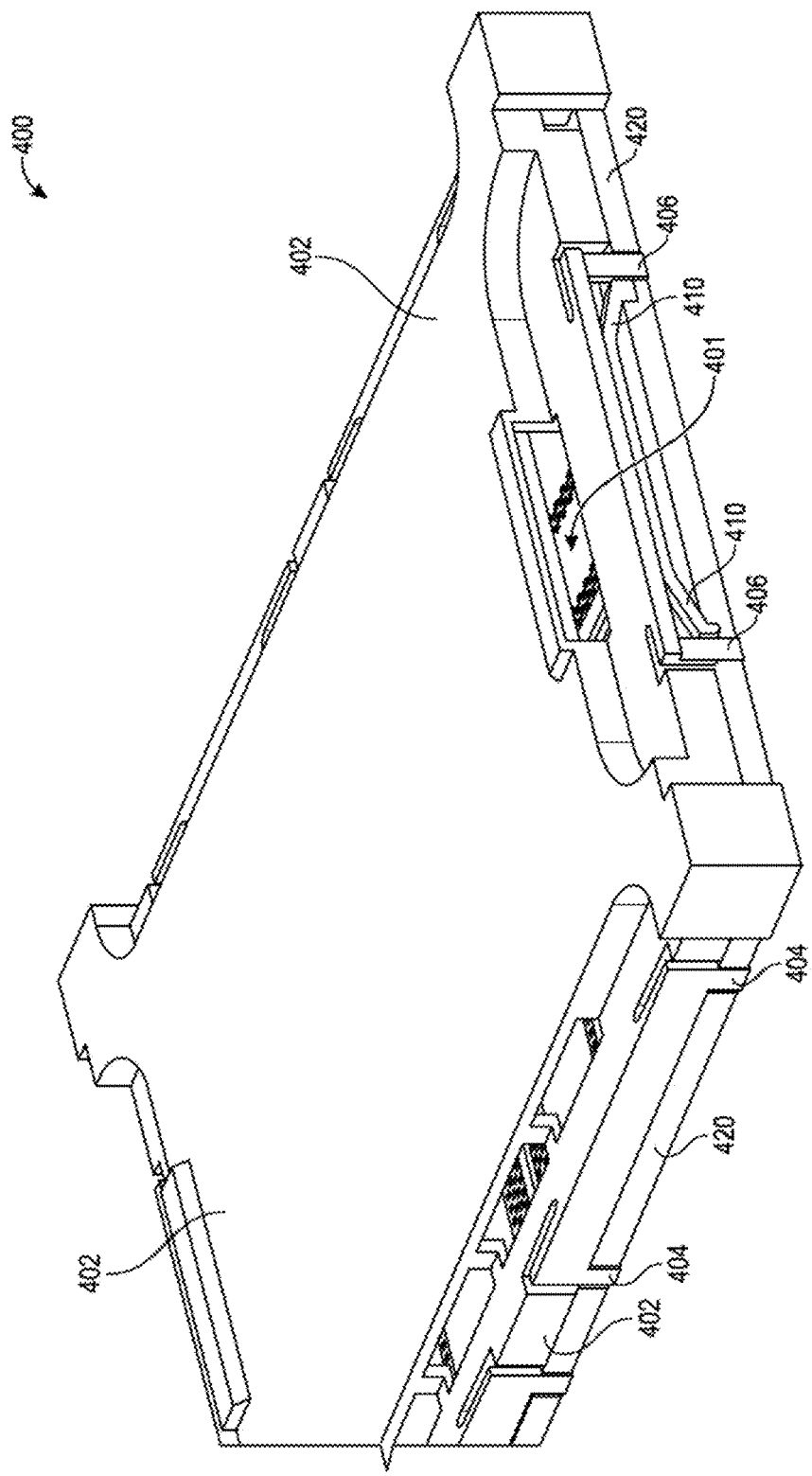
FIG. 4 illustrates an example spring incorporated in a cap to flatten a socket housing, in accordance with embodiments.

FIG. 4 illustrates an example spring incorporated in a cap to flatten a socket housing, in accordance with embodiments. Diagram 400 shows a cap 402, which may be similar to cap 102 of FIG. 1A, that is coupled with a socket 420, which may be similar to socket 120 of FIG. 1A. The resulting space between them 401 may normally be filled by one or more chips (not shown). In locations, the cap 402 may be coupled with the socket 420 using latches 404, which may be similar to latch 200a of FIG. 2A. In embodiments, latches 406, may be proximate to springs 410, which may be a part of cap 402, that press down on a portion of the socket 420 when the cap 402 is latched to the socket 420. In this way, areas of the socket 420 proximate to the contact points of the spring 410 will receive a downward force, and cause those areas to deform in the direction of the downward force. In embodiments, the positioning of this downward force may be used to adjust the shape of the socket 420. For example, to cause a base of the socket 420 to be flattened. In embodiments, the downward force is reacted upward at the latch 406 which is what couples the housing to the stiff and flat cap 402.

In embodiments, the latches 404, the latches 406, and springs 410 may be molded from the same material and be part of the cap 402 structure. In other embodiments, the latches 404, 406 and springs 410 may be separately manufactured and then subsequently coupled with the cap 402.

Other embodiments can include any type of spring, which may be defined as a mechanical structure that has a stiffness and a deflection range such that it can absorb tolerances from manufacturing and warpage. The deflection range required to be absorbed may be as little as 25 µm and as high as 1 mm, depending on the amount of force that is applied during the cap 402 installation. In some embodiments, forces may be within a range of 0.25 lbf to 10 lbf. In embodiments, these forces may be described as being applied in a Z direction of the socket 420 that may be perpendicular to a plane of the socket 420.

Figure 5:
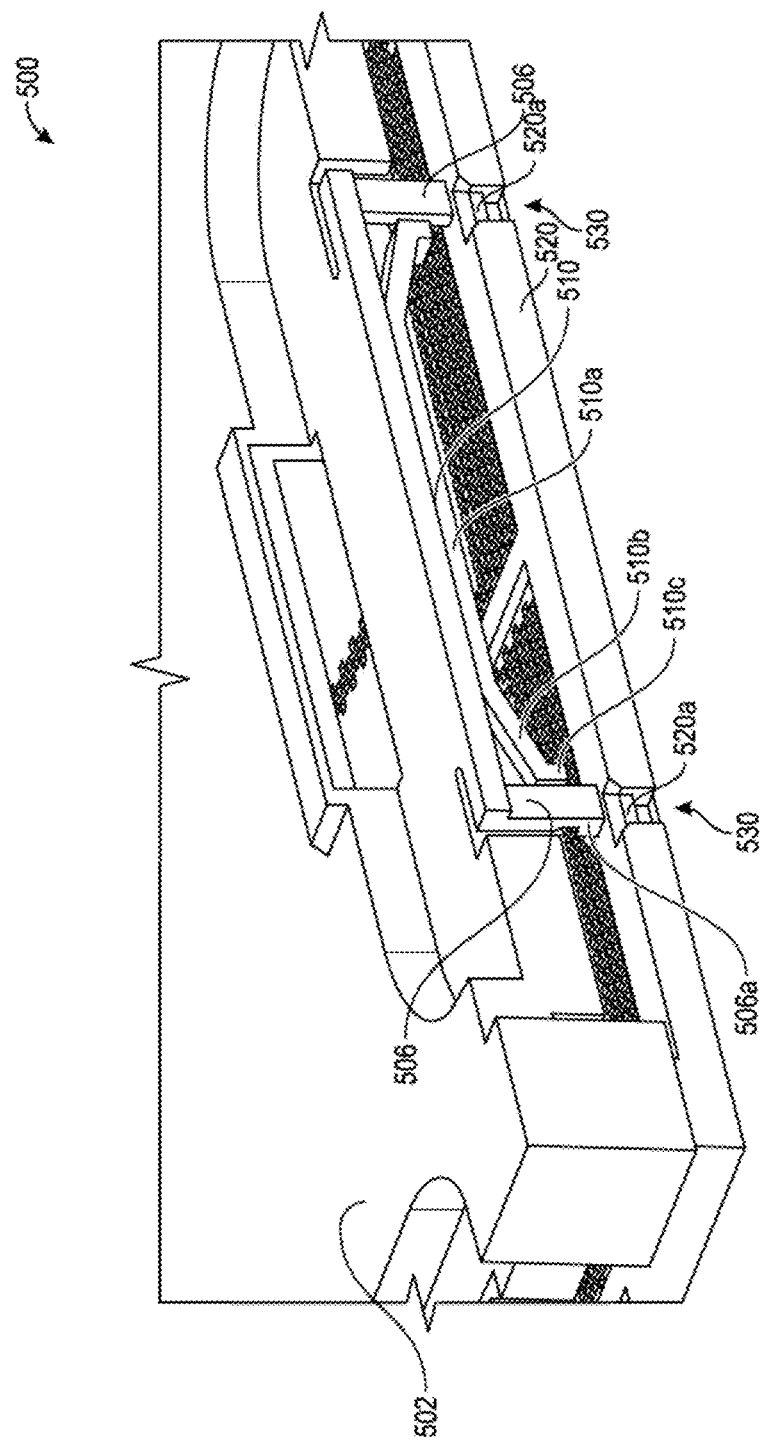
FIG. 5 illustrates details of an example spring incorporated into a cap, in accordance with embodiments.

FIG. 5 illustrates details of an example spring incorporated into a cap, in accordance with embodiments. Diagram 500 shows a cap 502, which may be similar to cap 402 of FIG. 4, that is in the process of being coupled with a socket 520, which may be similar to socket 420 of FIG. 4. Spring 510, which may be similar to spring 410 of FIG. 4, may include a main part 510a that may be of a varying distance depending upon the location and the downward force at the location to be applied on the socket 520. A cantilevered part 510b may be used to apply at least a portion of the spring action, which also may be referred to as a stroke of the spring. As shown, the cantilevered part 510b is an angled piece that may be part of the cap 502. In other embodiments, the cantilevered part 510b may take a different shape, such as a coil, a loop, or may be made of a different material such as a metal with a thickness designed to various springing characteristics. A contact portion 510c may come into direct contact with parts of the socket 520, and apply the downward force of the spring 510. In embodiments, the downward force is perpendicular to a plane of the socket 520. Prior to the fixing of the cap 502 to the socket 520, the cantilevered part 510b and contact portion 510c would be in an undeflected position as shown, where no load is applied.

In embodiments, the spring 510 would be deflected and apply a force to the socket 520 when the cap 502 is latched onto the socket 520. Latch 506, which may be tangent to the spring 510, may have a locking portion 506a, which may be similar to lower portion 207a of FIG. 2A, that will slip into slot 530, which may be similar to space 230 of FIG. 2C, and latch against the stop 520a. In embodiments, the structure and materials used for the locking portion 506a and the stop 520a may be designed to withstand different degrees of stress without breaking.

As shown, the spring 510 has two contact points 510c to apply pressure to the socket 520 in two different locations. In other embodiments, the spring 510 may have only one contact point. In other embodiments there may be multiple springs 510 along a side of the socket 520, or along a plurality of the sides of the socket 520. In embodiments, the springs may be located around interior edges within the socket 520, for example along edges that border holes such as holes 326 of FIG. 3.

Figure 6:
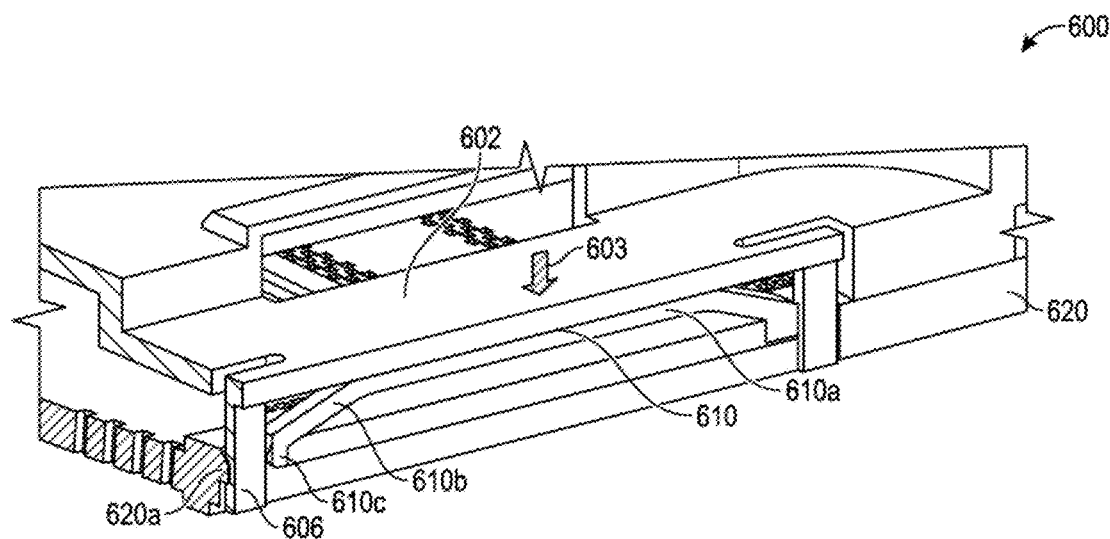
FIG. 6 illustrates a cutaway of a latch inserted into a latch retention cut out incorporated with an example spring in a cap, in accordance with embodiments.

FIG. 6 illustrates a cutaway of a latch inserted into a latch retention cut out incorporated with an example spring in a cap, in accordance with embodiments. Diagram 600 shows the cap 602 and spring 610 which may be similar to cap 502 and spring 510 of FIG. 5, after they are coupled with the socket 620, which may be similar to socket 520 of FIG. 5. As shown, one of the latches 606 is coupled with a retaining feature 620a that is part of the socket 620 to lock the cap 602 in place. The spring cantilevered portion 610b and contact portion 610c are deflected and are in physical contact with socket 620. This provides a downward force against an edge of the socket 620 and will cause a deflection downward in the socket 620 proximate to the location of the contact portion 610c.

Figure 7:
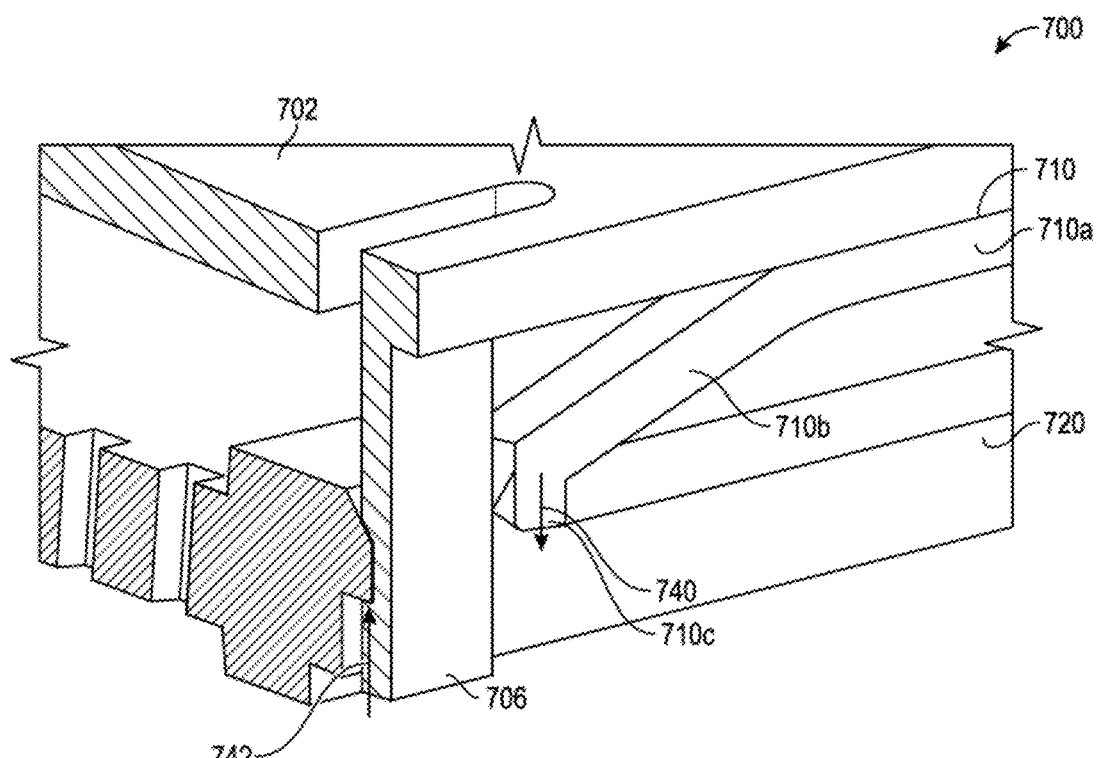
FIG. 7 illustrates details of a cutaway of a latch inserted into a latch retention cut out incorporated with an example spring in a cap, in accordance with embodiments.

FIG. 7 illustrates details of a cutaway of a latch inserted into a latch retention cut out incorporated with an example spring in a cap, in accordance with embodiments. Diagram 700 shows a detail of a portion of diagram 600 of FIG. 6. Latch 706, spring 710, and socket 720 may be similar to latch 606, spring 610 and substrate 620 of FIG. 6 show that a force 742 is applied upward to the socket 720. A force 740 is applied downward by the cantilever portion of the spring 710b, connected to the top of the spring 710a, with the contact portion 710c of the spring in contact with the socket 720. These forces 740, 742 in conjunction may cause other areas of the socket 720 body to deflect and to change the shape of the socket 720 body.

Figure 8:
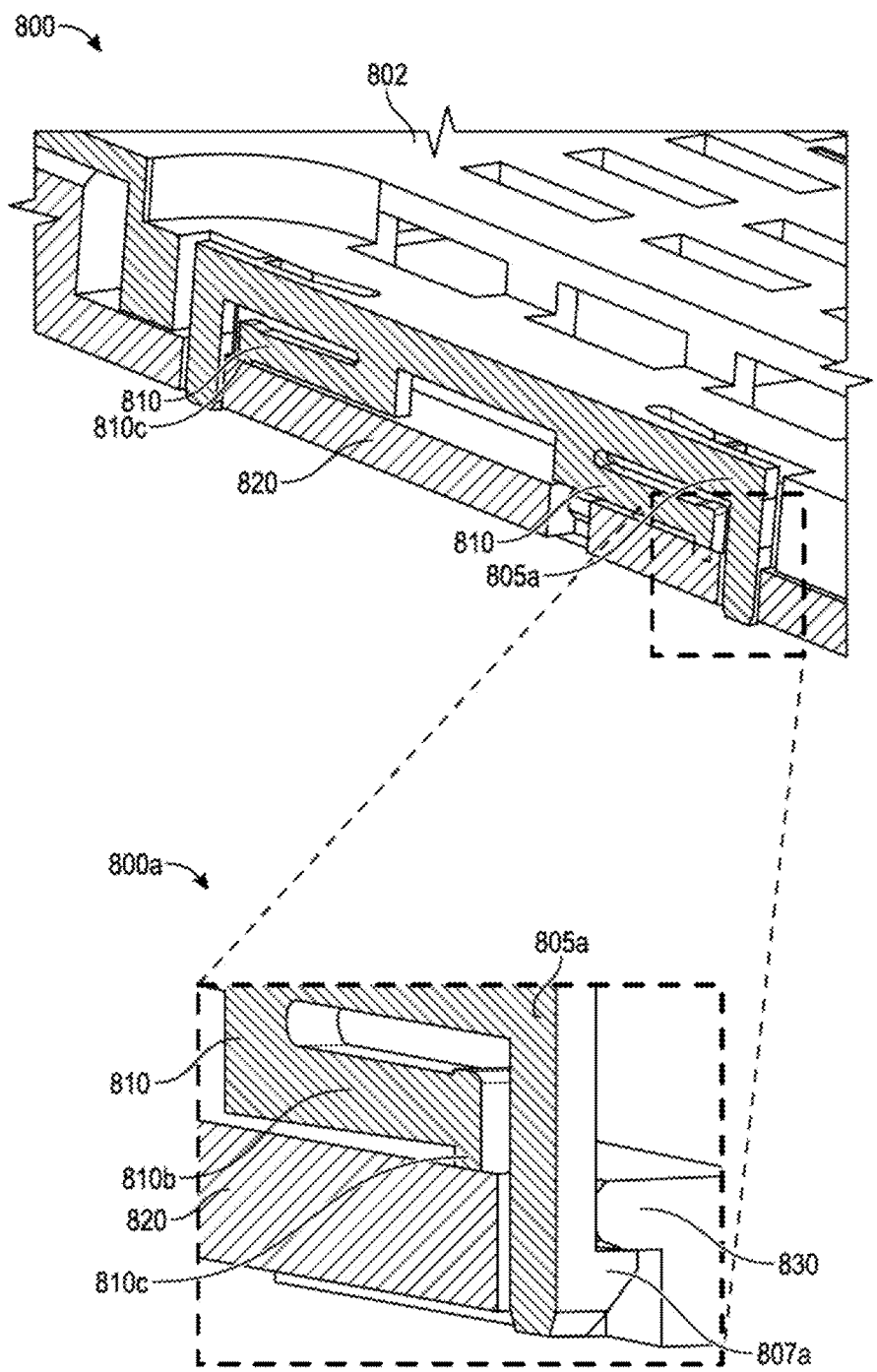
FIG. 8 illustrates an alternative embodiment of an example spring incorporated in a cap to flatten the socket housing, in accordance with embodiments.

FIG. 8 illustrates an alternative embodiment of an example spring incorporated in a cap to flatten the socket housing, in accordance with embodiments. Diagram 800 shows a cap 802 and a socket 820, that may be similar to cap 702 and socket 720 of FIG. 7, with a spring mechanism 810 with a contact point 810c that is tangent to and applying pressure to the socket 820. Diagram 800a shows a portion of diagram 800 in greater detail. The spring mechanism 810 includes a cantilevered part 810b that is coupled with a contact part 810c to apply a downward force on to the socket 820. A lower portion of the latch 807a may come in contact with a portion of the socket 830 to keep the cap 802 firmly coupled with the socket 820 so that the spring mechanism 810 is able to apply full force without uncoupling the cap 802 and the socket 820. In embodiments, an upper portion of the latch mechanism 805a may be used to release the lower portion of the latch 807a by depressing the upper portion. As shown in this embodiment, the spring cantilever 810b and contact point 810c do not come into contact with the latch mechanism 805a, 807a. In embodiments, the spring mechanism 810 may be a metal or an LCP spring. In alternative embodiments, the spring 810 may extend from the socket 820 or socket housing to the cap 802 to apply a force from the cap 802 to the socket 820 to adjust the socket 820.

Figure 9:
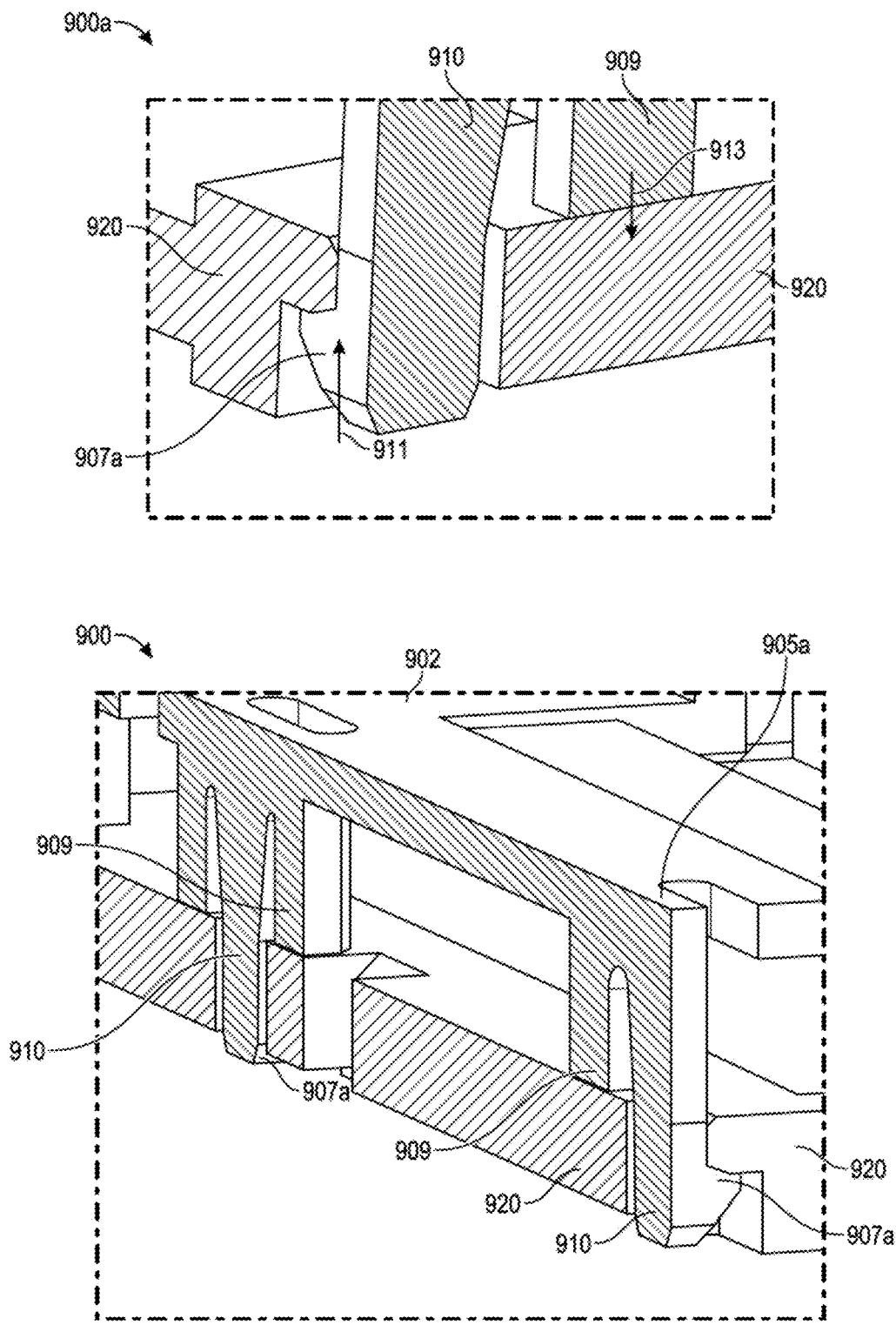
FIG. 9 illustrates another alternative embodiment of an example spring incorporated in a cap to flatten the socket housing, in accordance with embodiments.

FIG. 9 illustrates another alternative embodiment of an example spring incorporated in a cap to flatten the socket housing, in accordance with embodiments. Diagram 900 shows a cap 902 and socket 920, which may be similar to cap 802 and socket 820 of FIG. 8. In this embodiment, the spring may be combined into the latch 910 to provide an upward force against the socket 920 by the lower portion 907a pressing against socket 920. In embodiments, a latch release 905a may release the cap 902 from the socket 920. The spring may also be combined into other supporting structures 909 to provide force against the socket 920. In these embodiments, the spring would be a low deflection, high force design to form the socket 920 into a shape of the cap 902.

As shown in diagram 900a, the force 911 resulting from the latch 910 with lower part 907a pulling up on socket 920, and the force 913 applied downward into the socket 920 may be used to alter the shape of the socket 920 to conform to a shape of the cap 902, or some other shape prior to application of the socket to a substrate (not shown).

Figure 10:
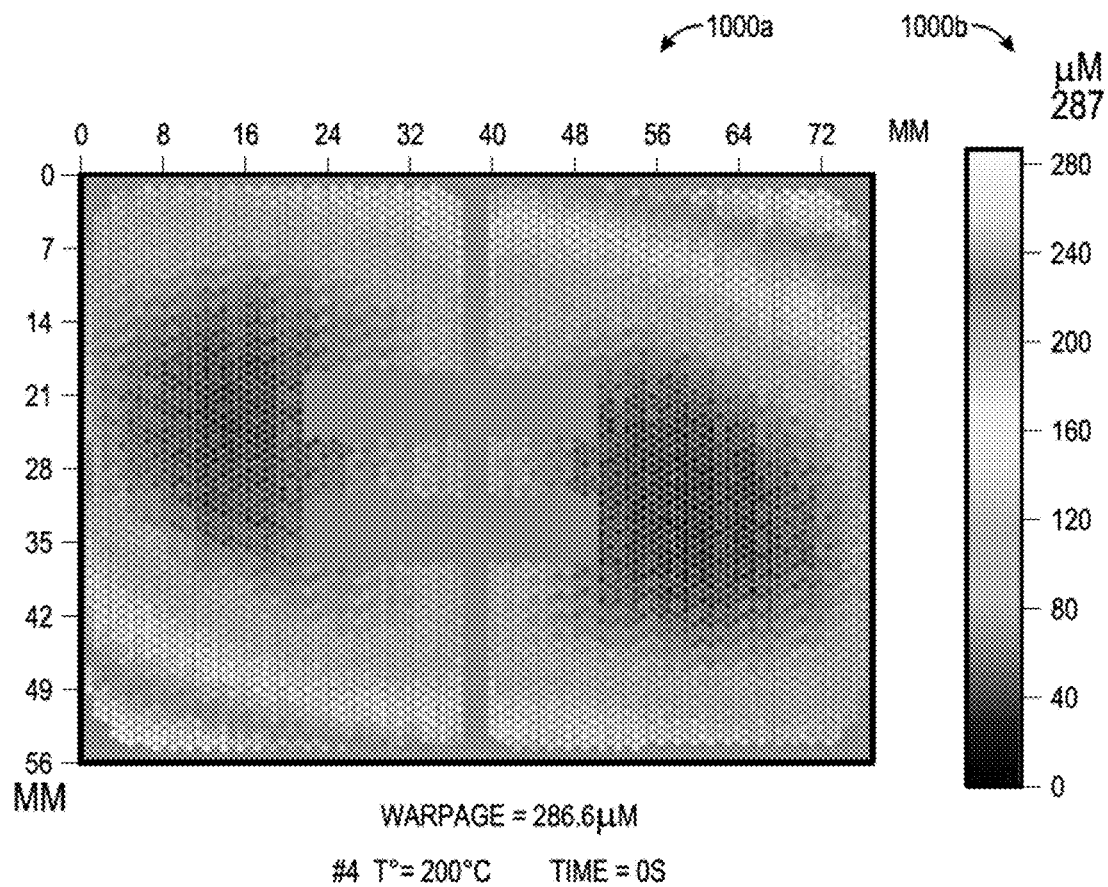
FIG. 10 illustrates a graph of warpage data where no cap to flatten the socket has been applied, in accordance with embodiments.

FIG. 10 illustrates a graph of warpage data where no cap to flatten the socket has been applied, in accordance with embodiments. Diagram 1000a shows an example of a PnP cap, such as cap 102 applied to a socket such as socket 120 of FIG. 1A, undergoing a high temperature warpage measurement that may change this shape of the socket. Diagram 1000b shows a legend representing the various measurements of deflection. As shown by these measurements, the legacy latch that couples the cap to the socket is not strong enough to flatten the socket or preferably a truly bend it or fully flatten it, however it may affect the warpage of the socket.

Figure 11:
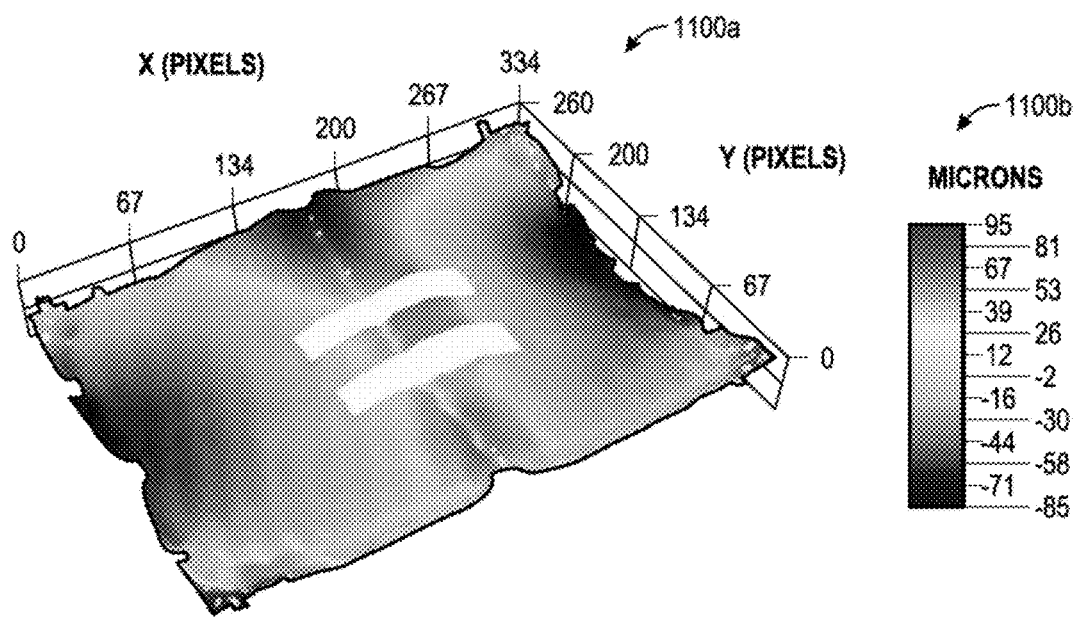
FIG. 11 illustrates a graph of warpage data where a cap to flatten the socket has been applied, in accordance with embodiments.

FIG. 11 illustrates a graph of warpage data where a cap to flatten the socket has been applied, in accordance with embodiments. Diagram 1100*a* shows an example of embodiments of a cap, such as cap 902 and socket 920 of FIG. 9, used to control the warpage of the socket undergoing high-temperature. Diagram 1100*b* shows a legend representing the various measurements of deflection. As shown by these measurements, embodiments of the cap and associated spring mechanisms when coupled with the socket may substantially affect the warpage of the socket.

FIG. 12 illustrates an example of a package coupled with a motherboard using solder balls. Diagram 1200 includes a motherboard 1250 with pads 1253 that is coupled with a socket 1254 using solder balls 1252. The pads 1253 may be solder paste printed on the motherboard 1250. The socket 1254 is connected to a package 1258 that is coupled with an integrated heat spreader (IHS) 1262 that may be thermally coupled with the package 1258 by the thermal interface material (TIM) 1260. The socket 1254 includes a plurality of connectors 1256, which may also be referred to as contacts, that include package connectors 1256*a* that are bent to couple with pads (not shown) on the package 1258, and include a plurality of motherboard connectors 1256*b* to electrically couple with solder balls 1252 that then in turn electrically couple with the motherboard 1250.

FIG. 13 illustrates an example of a package coupled with the motherboard using pads in the substrate, in accordance with embodiments. Diagram 1300*a* includes a motherboard 1350 that is coupled with the socket 1354 via pads 1353 on the motherboard 1350. The socket 1354 is connected to a package 1358 that is coupled with an IHS 1362 that may be thermally coupled with the package 1358 with a TIM 1360. The socket 1354 includes a plurality of connectors 1356 that include package connectors 1356*a* that are bent to couple with pads (not shown) on the package 1358. The socket 1354 also includes a plurality of motherboard contacts 1356*b* to electrically couple with pads 1353 on the motherboard 1350. In embodiments, when the motherboard connectors 1356*b* are coupled with the pads 1353, the coupling may provide a sufficient physical force to keep the socket 1354 firmly physically and electrically coupled with the motherboard 1350. This coupling may persist despite warpage forces that may be applied to the socket 1354 or motherboard 1350 due to heat or other physical stresses during package operation. As shown with respect to diagram 1300*b*, the motherboard 1350 includes pads 1353, but does not include solder balls 1252 of FIG. 12. In embodiments, the motherboard 1350 may be a substrate, or maybe some other component to which the socket 1354 may be physically and/or electrically coupled.

Figure 14:
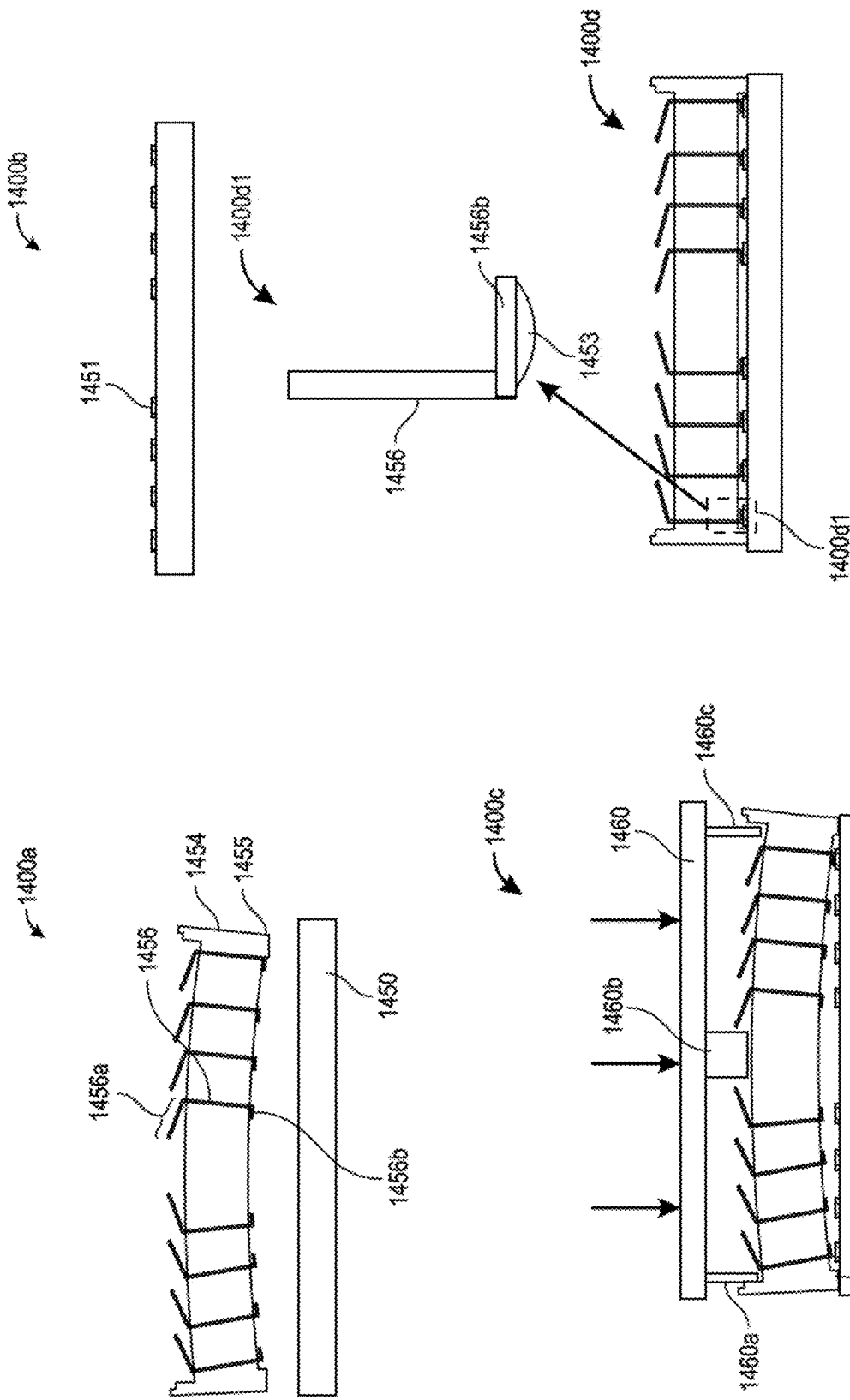
FIG. 14 illustrates various stages during manufacture to couple a socket without solder balls to a motherboard using an external load to flatten the socket, in accordance with embodiments.

FIG. 14 illustrates various stages during manufacture to couple a socket without solder balls to a motherboard using an external load to flatten the socket, in accordance with embodiments. Diagram 1400*a* shows a socket 1454 that includes a plurality of connectors 1456, which also may be referred to as contacts, that are to be coupled with a motherboard 1450, which may be similar to socket 1354, contacts 1356, and motherboard 1350 of FIG. 13. In embodiments, the socket 1454 may have a standoff 1455, which may be physically coupled with the motherboard 1450 to provide a gap between a side of the socket 1454 and the motherboard 1450. Note that the socket 1454 is warped with respect to the motherboard 1450, such that a side of the socket 1454 is not parallel with the motherboard 1450. In embodiments, there may be other implementations of warpage in the socket 1454. In embodiments, contacts 1456 may include a J lead 1456*b* to electrically couple with the motherboard 1450, and a bent contact 1456*a* to electrically couple with a package, such as package 1356 of FIG. 13. The J-lead 1456*b* will have a dome shaped or similar protrusion 1453. This feature will improve solder wetting and control wicking, and to enable joints without a solder ball connection.

Diagram 1400*b* shows motherboard 1450 with solder paste 1451 applied to the pads on (not shown) motherboard 1450.

Diagram 1400*c* shows socket 1454 to which pressure from a load plate 1460 and pressure members 1460*a*, 1460*b*, 1460*c* is physically applied to electrically and/or physically couple the socket 1454 to the substrate 1450. In embodiments, the load plate 1460 may be a PNP cap, similar to cap 402 of FIG. 4. The load plate pressure members 1460*a*, 1460*b*, 1460*c* may come into contact with the socket 1454 at various points to apply pressure to the socket 1454 to alter its shape, for example to flatten the socket 1454 out. In embodiments, the pressure members 1460*a*, 1460*b*, 1460*c* may be a part of the load plate 1460. In embodiments, the load plate may include springs or other mechanical features that allow the load to be evenly distributed across the socket. Features that locate and or lock the load plate 1460 into place, with the substrate and/or the socket body/cap could be present to prevent X-Y-Z movement of the load plate 1460. The load plate 1460 can be any feature which applies additional weight in order to flatten the socket 1454. This can be metal, high temperature plastic, or by thickening the existing pick and place cap. In embodiments, the load may be placed onto the socket 1454 or socket cap using existing PNP technology, specific tooling/machinery, and/or a manual process.

Diagram 1400*d* shows the results of the application of the load plate 1460 after reflow where the various J connectors 1456*b* have been coupled with the pads 1451 on the motherboard 1450. Diagram 1400*d*1 shows a detail of a J connector 1456*b* with the dome-shaped protrusion 1453 as discussed above. In embodiments, a high quality and secure physical and/or electrical connection is made between the socket 1454 and the motherboard 1450, after the load plate 1460 and pressure members 1460*a*, 1460*b*, 1460*c* have been removed. The techniques described herein may be used during SMT to flatten the socket 1454 and therefore to provide a higher SMT yield. In addition, these techniques may be used to allow the socket 1454 to be subject to SMT without solder joints. Since solder balls cause electrical impedance mismatch, they result in high speed I/O (HSIO) signal loss and resonance. Removing the solder balls, therefore, has advantages for scaling HSIO to higher than 20 GHz frequency bandwidth.

Figure 15:
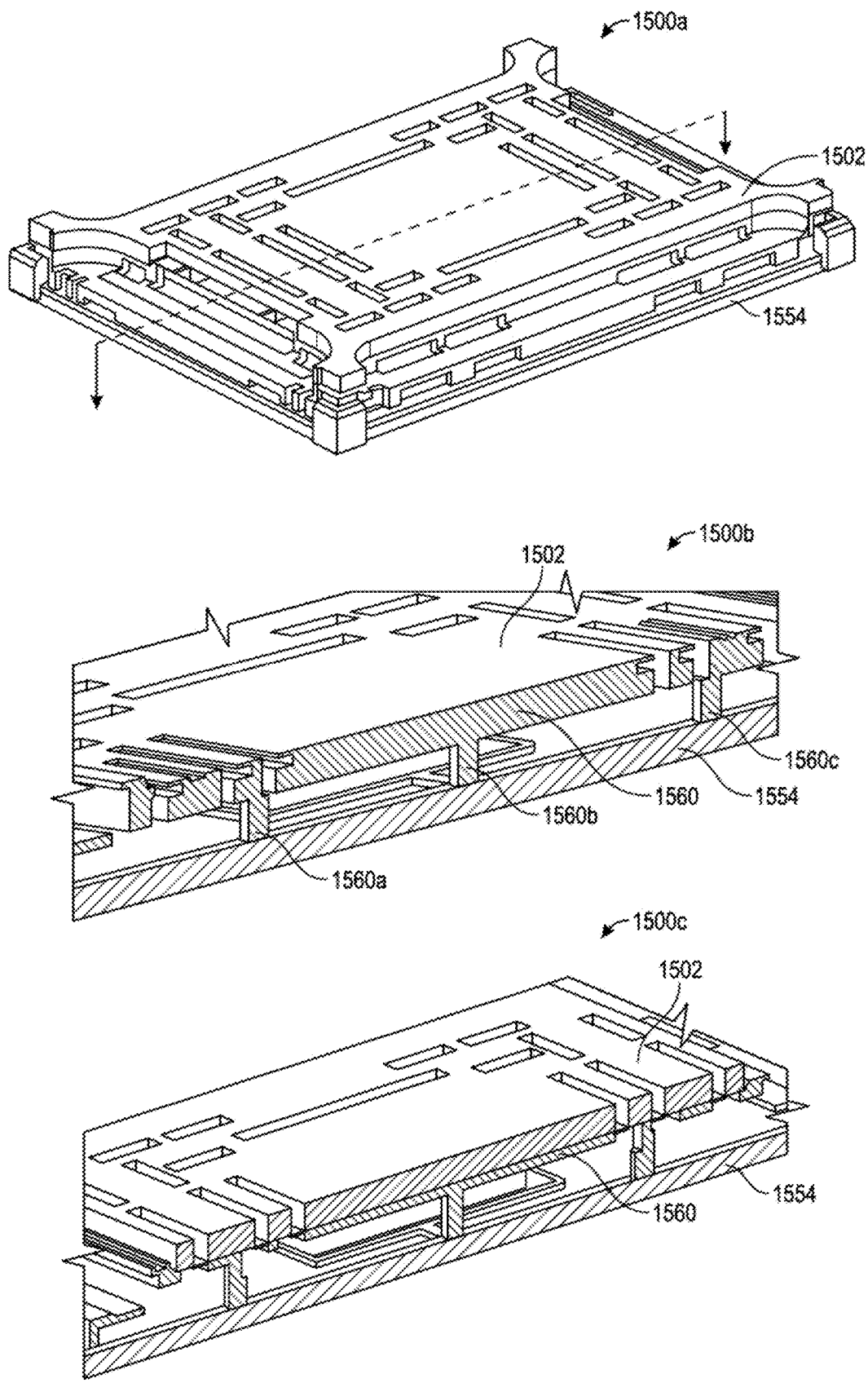
FIG. 15 illustrates examples of coupling a socket to a substrate using an external load to flatten the socket, in accordance with embodiments.

FIG. 15 illustrates examples of coupling a socket to a substrate using an external load to flatten the socket, in accordance with embodiments. Diagram 1500*a* shows an example assembly of a cap 1502 coupled with the socket 1554, which may be similar to cap 402 and socket 420 of FIG. 4. The dotted lines show a cross-section location for diagrams 1500*b* and 1500*c* below.

Diagram 1500*b* shows one embodiment where the cap 1502 incorporates the load plate 1560, which may be similar to 1460 of FIG. 14 as well as pressure members 1560*a*, 1560*b*, 1560*c* which may be similar to pressure members 1460*a*, 1460*b*, 1460*c* of FIG. 14. In this embodiment, the cap 1502 may be used by a PNP machine to place the combination load plate and cap onto the socket 1554. In embodiments, this may involve thickening the cap 1502 to add additional weight. After the cap 1502 is applied, the SMT reflow process may start.

Diagram 1500*c* shows another embodiment where the cap 1502 is separate from the load plate 1560 and individual members 1560*a*, 1560*b*, 1560*c*. In embodiments, the load plate 1560 may be applied to the socket 1554 first, and then the cap 1502 may be placed over the load plate 1560 and coupled with the socket 1554. In embodiments, the load plate may be a separate metal piece. In embodiments, and as discussed above, when the cap 1502 is placed over the load plate 1560 and the socket 1554, the cap 1502 may then be locked to the socket 1554, where increased pressure by the cap 1502 applied to the load plate 1560 may further shape the socket 1554 in preparation, for example, for the SMT process.

Figure 16:
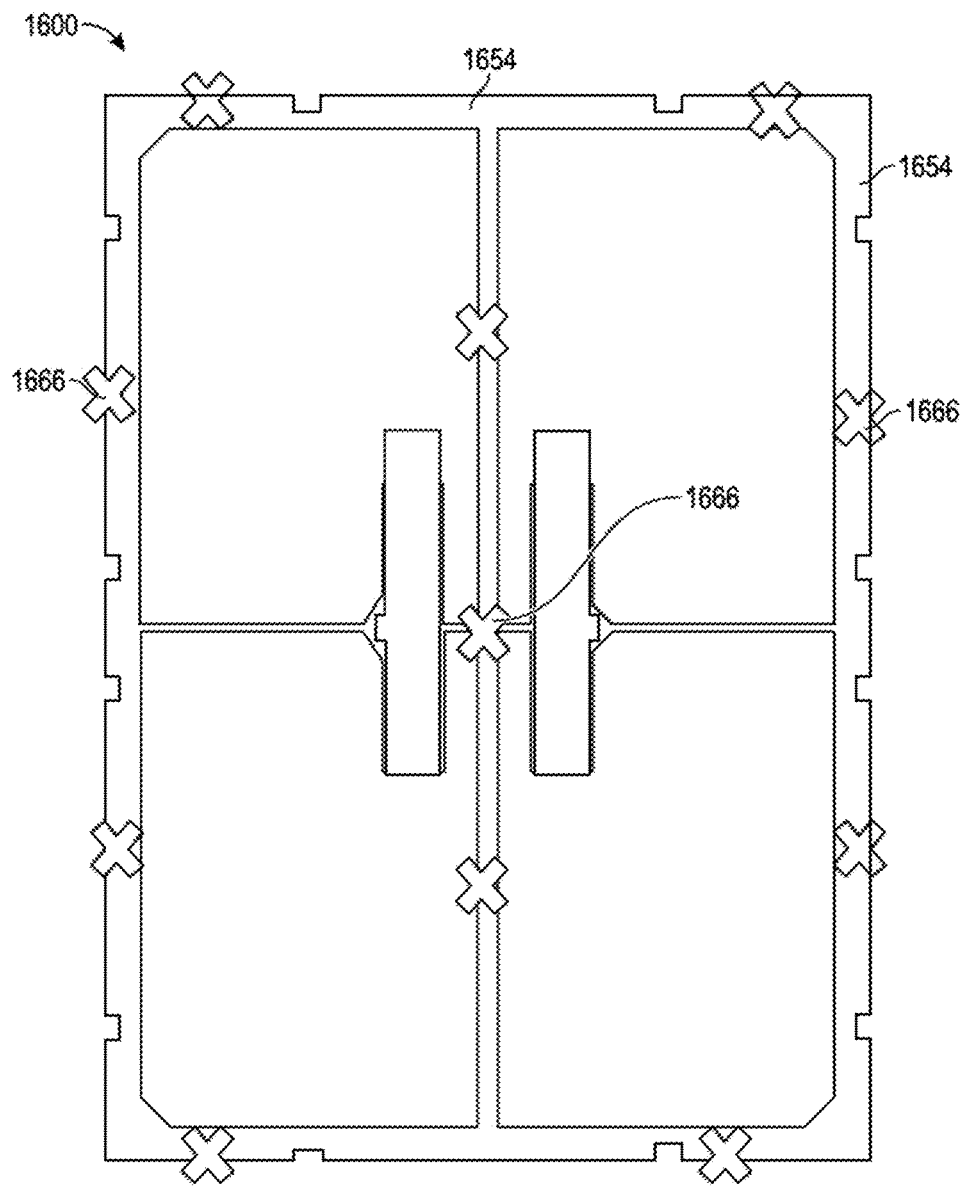
FIG. 16 illustrates an example socket with points indicating locations to which an external load may be applied to flatten the socket, in accordance with embodiments.

FIG. 16 illustrates an example socket with points indicating locations to which an external load may be applied to flatten the socket, in accordance with embodiments. Diagram 1600 shows an example of a socket 1654, which may be similar to socket 1554 of FIG. 15, showing various locations 1666 to where members of a load plate, such as load plate 1560 and pressure members 1560*a*, 1560*b*, 1560*c* of FIG. 15, may be applied. In embodiments, the locations 1666 may be chosen based on the geometry of the socket 1654 or various types of materials that may have different stress points throughout the location 1666. In embodiments, the locations 1666 may be chosen based on known warpage points of the socket 1654 in order to flatten the socket. In embodiments, as many locations 1666 as may be feasible may be used so that the flattening effect is maximized. In embodiments, this may be constrained by other aspects of the design, for example, the number of required pins or the ability to place standoffs is described in FIG. 17, which transfer load from the pressure members 1560*a*, 1560*b*, 1560*c* to the socket 1554 of FIG. 15 and prevents bridging.

Figure 17:
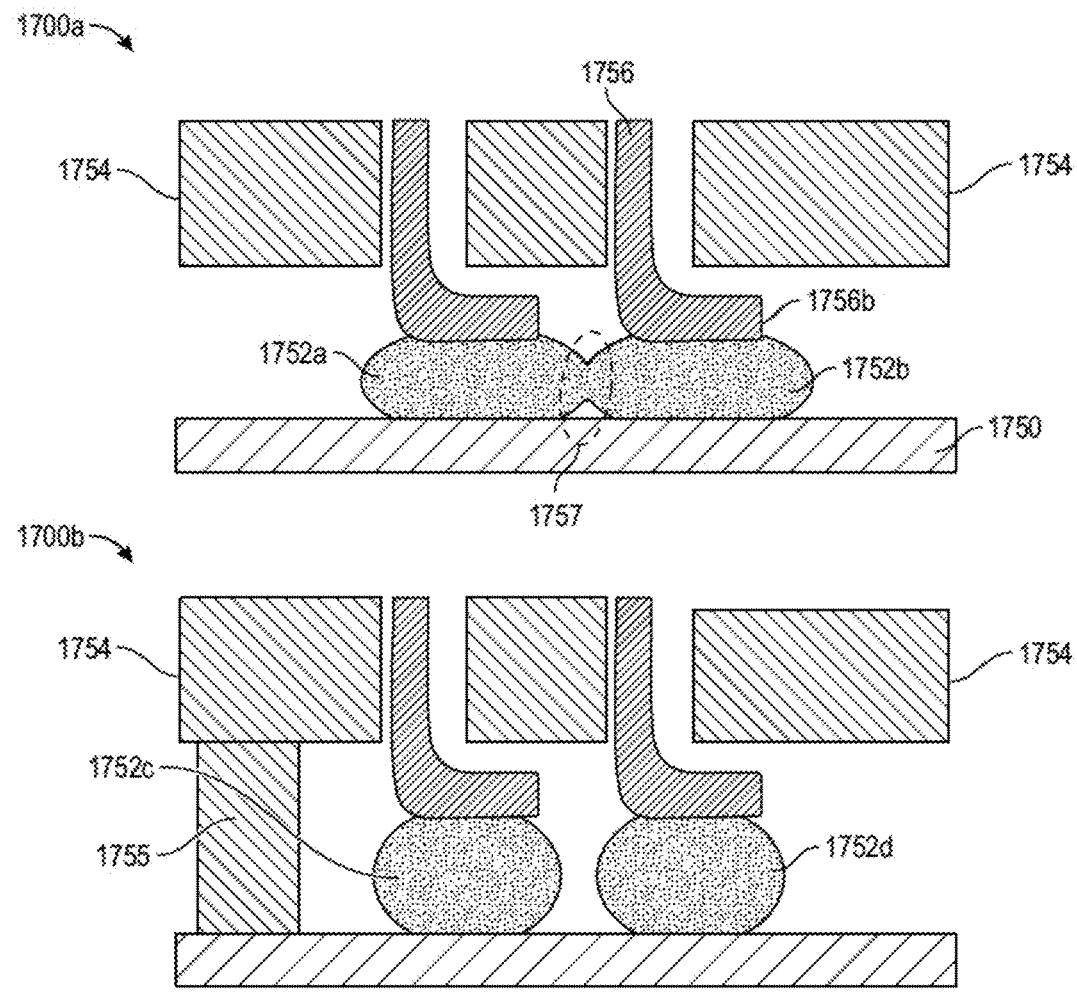
FIG. 17 illustrates an example socket with standoffs to flatten the socket, in accordance with embodiments.

FIG. 17 illustrates an example socket with standoffs to flatten the socket, in accordance with embodiments. Diagram 1700*a* shows a close-up view of a two socket contacts 1756 within socket 1754 with J connectors 1756*b* coming into contact with the solder balls 1752*a*, 1752*b* that are placed on a motherboard 1750. Without standoffs 1755, when force is applied to the socket 1574 using techniques described herein, the solder balls 1752*a*, 1752*b* may flatten and come into contact in areas 1757, resulting in an electrical short. This may also be referred to as solder ball bridging.

Diagram 1700*b* shows a socket 1754 that includes standoffs 1755 to serve as locations to prevent solder ball bridging during the SMT process. A load plate and members, such as load plate 1560 and members 1560*a*, 1560*b*, 1560*c* of FIG. 15 may be applied. In this embodiment, pressure from a load plate may be applied over a larger surface on a socket 1754. This may allow the pressure to be applied to adjust the shape of the socket, for example to flatten it out, with greater control or with greater pressure applied over various regions of the socket 1754. In embodiments, the standoffs 1755 may be added to the socket 1754 to help prevent warpage in the socket 1754 at the time of manufacture. Standoffs 1755 may also be used to prevent over collapse of the socket and resulting solder joint defects.

Figure 18:
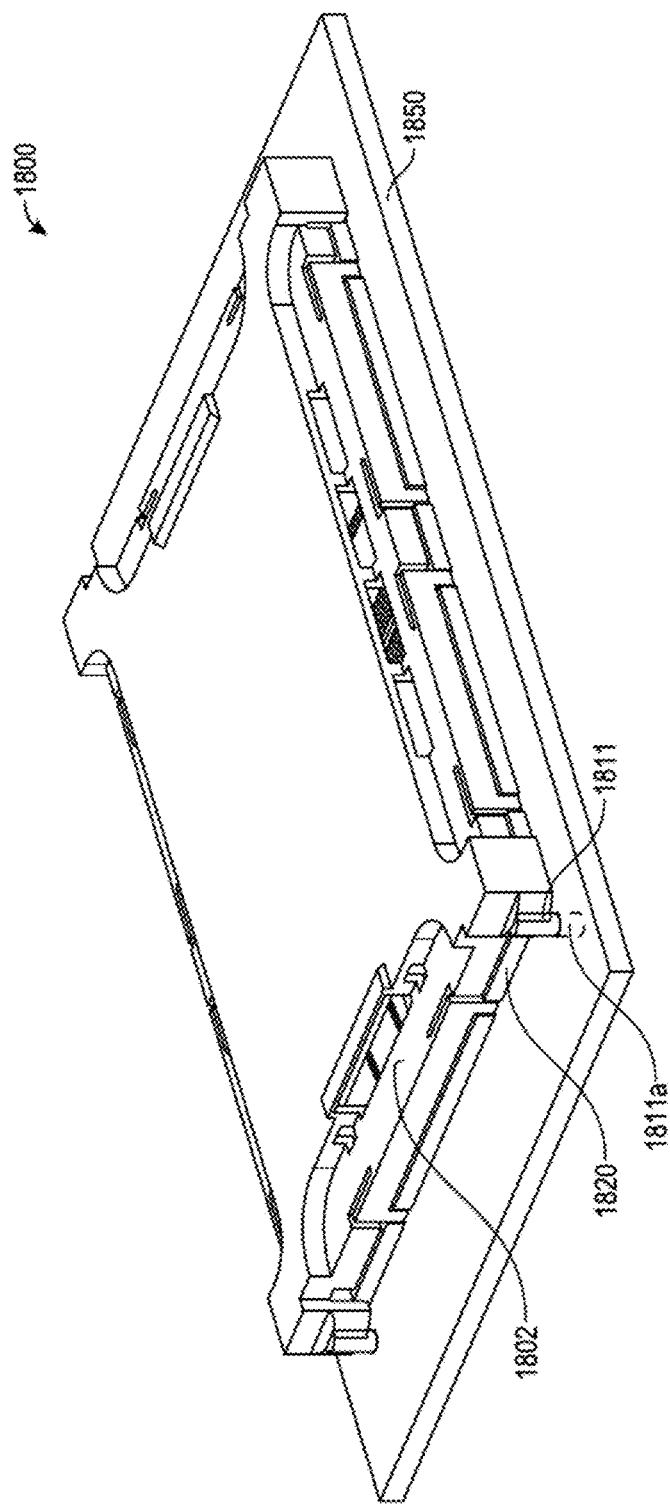
FIG. 18 illustrates an example cap that includes pins to constrain movement of a socket on a substrate, in accordance with embodiments.

FIG. 18 illustrates an example cap that includes pins to constrain movement of a socket on a substrate, in accordance with embodiments. Diagram 1800 shows a technique to prevent lateral movement of a socket 1820 on a substrate 1850, the socket 1820 may be similar to socket 420 of FIG. 4. In embodiments, a pin 1811 may be inserted into a substrate 1850 in a hole 1811*a* of the substrate 1850 to secure the socket 1820 from moving in an X-Y-Z direction on the substrate 1850. In embodiments, multiple pins 1811 could be inserted to secure the socket 1820 from moving with respect to the substrate 1850. In embodiments, these X-Y-Z direction movements may result from lateral accelerations and vibrations during the SMT process from which defects could result. In addition, adding additional features such as the load plate 1560 of FIG. 15 may add additional inertia or force that may translate into X-Y movement in the socket 1820, which pin 1811 may prevent.

In embodiments, the pin 1811 may be part of a cap 1802, part of a load plate 1560 of FIG. 15, or part of the socket 1820. In addition, other features that may be adjacent to the socket (not shown) may be pinned to the substrate 1850 or attached to processing fixtures such as a pallet or other fixture to prevent movement of the socket 1820 on the substrate 1850. It should be noted that any combination of the techniques described herein may be used to mitigate X-Y-Z movement of the socket 1820 on the substrate 1850.

FIG. 19A-19D illustrate a set of actions for using a carrier frame to house multiple independent socket segments, in accordance with embodiments. As illustrated by diagram 1900*a* of FIG. 19A, a carrier frame 1962, which may also be referred to as a tray fixture, is used to hold socket segment 1954 prior to surface-mounted. In embodiments, the socket segment 1954 is held against the portion 1963 using a latch mechanism 1961, which may also be referred to as a spring finger. A lower portion 1961*a*, which may also be referred to as an edge, secures the socket segment 1954 to the carrier frame 1962. In embodiments, the lower portion 1961*a* may clip into a lower side of the socket 1954, or into a notch 1954*a* made into the socket 1954. In embodiments, portion 1963 of the carrier frame 1962 come into physical contact with at least a portion of the electrical contacts in socket segment 1954 to cause them to deflect a small amount. The small contact deflection would generate a downward force to ensure that the gap between socket notch 1954*a* and the latch 1961*a* is always zero under assembled condition.

In embodiments, the socket may include a ball grid array segment 1956 on one side of the socket segment 1954, and a contact array 1958 on a side opposite the ball grid array 1956. In embodiments, the carrier frame 1962 may include multiple sockets 1954 within a single carrier. The number of segments could be as many as 2, 3, 4, 6, 8, or higher. Each socket segment 1954 is small, but the combination of them may be inserted into a large socket. The smaller size of each socket segment 1954 make them cheaper to produce and reduce the yield loss impact, for example by discarding one socket segment 1954 instead of the whole assembly. In embodiments, each socket segments is tightly held to its X and Y position using the spring fingers 1961*a* and the force generated by the contact interference at portion 1963 may ensure that the ball-grid-array of all socket segments are on a same horizontal plane.

In embodiments, the carrier frame 1962 may be coupled with or otherwise incorporated into a PNP cap, such as cap 402 of FIG. 4, to be placed against a substrate using a PNP machine. The carrier frame could be made of injection molded material such as magnesium or magnesium which their coefficient of thermal expansion (CTE) are better matched with the motherboard PCB material. This would help the socket assembly to maintain its X and Y dimension after reflow, and to reduce any residue stress caused by the CTE mismatched. The reduction in residual stresses will improve the flatness of the overall socket assembly.

Figure 19C:
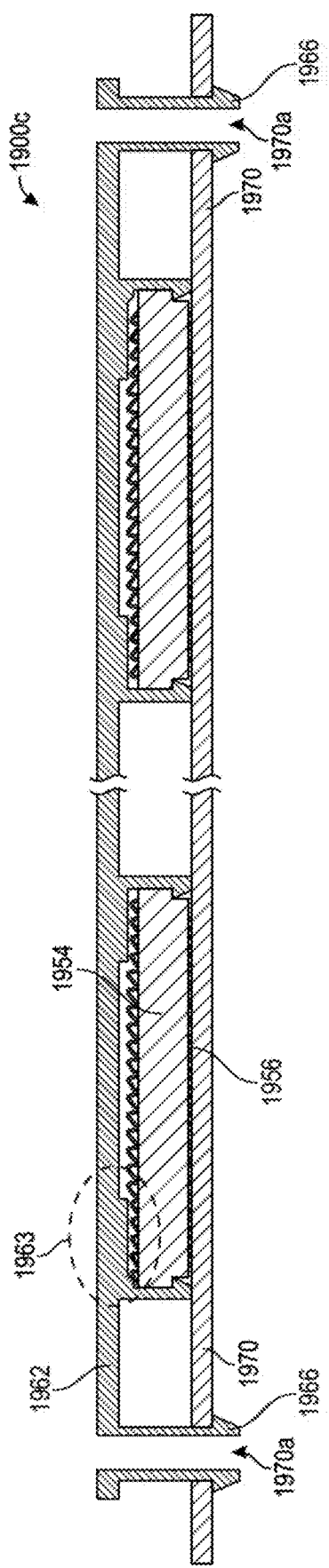

Diagram 1900*b* of FIG. 19B shows an alternate design of a carrier frame 1962 that add a locking post 1966. Diagram 1900*c* of FIG. 19C shows the locking post 1966 inserted into the board substrate 1970 within a hole 1970*a* in the substrate. The multiple locking posts 1966 would act as X-Y positional control, and to provide a slight compression force (Z-direction) between the BGA of all socket segments 1954 and the board substrate 1970. In embodiments, during placement of the carrier frame 1962 against a substrate, warpage in the sockets 1954 will be minimized because they remain in carrier frame 1962 as they are placed onto the substrate 1970 in preparation for reflow or other SMT techniques. In embodiments, the locking post 1966 may be implemented as shown, or may use of some other technology to secure the carrier frame 1962 to the substrate 1970. In embodiments, the pressure is applied to the socket 1954 in the areas 1963 to also provide mechanical pressure of the ball grid array 1956 onto the substrate 1970. The compression force will force the BGA of each socket segment to make contact with the paste on the board substrate to ensure good quality bonding after reflow, thus alleviate the need for tighter flatness control as if the socket is one single large piece.

Figure 19D:
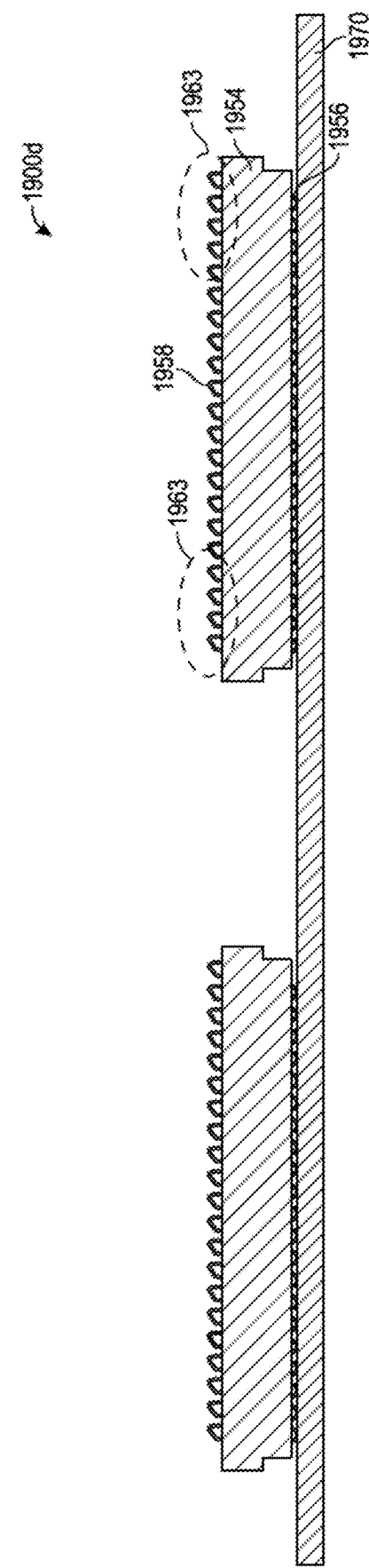

Diagram 1900d of FIG. 19D shows the removal of the carrier frame 1962 after reflow is complete. The resulting sockets 1954 are coupled with the substrate 1970 via the ball grid array 1956 to provide a quality physical and electrical coupling between the substrate 1970 and the socket 1954. Any individual leads of the contact array 1958 that were compressed by the carrier frame in area 1963 are now sprung back to its normal position. Subsequent to the mounting on the substrate 1970, one or more chips (not shown) may be applied to the contact array 1958 of the socket 1954.

Figures 20, 21:
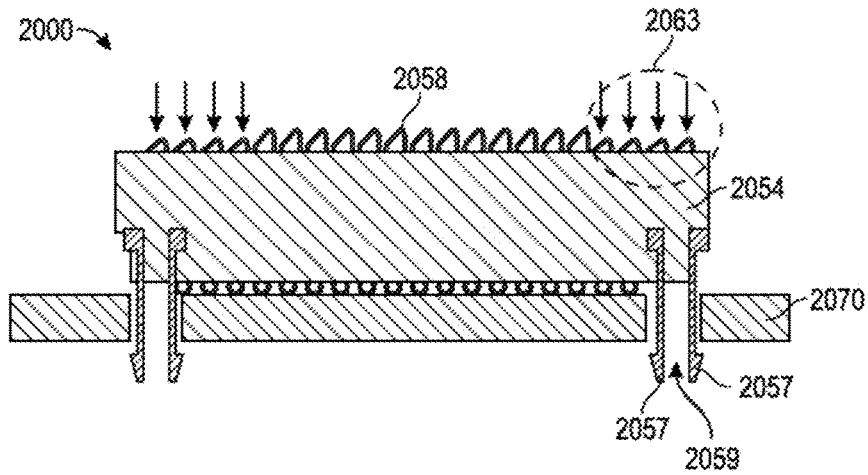
FIG. 20 illustrates an example socket with pins that extend into a substrate, in accordance with embodiments.
FIG. 21 illustrates an example of a process for coupling a cap with a socket to flatten the socket, in accordance with embodiments.

FIG. 20 illustrates an example socket with pins that extend into a substrate, in accordance with embodiments. Diagram 2000 shows an example of a socket 2054, which may be similar to socket 1954 of FIG. 19A, that includes securing features 2057 on the socket 2054 body that extend into a hole 2059 in the substrate 2070, which may be similar to substrate 1970 of FIG. 19D. The securing features 2057, which are shown as clips but are not limited to these implementations, may be used to secure the socket 2054 and provide tension between the substrate 2070 and the socket 2054 to remove any deformations in the socket 2054 when it is applied to the substrate 2070. The securing features 2057 may also keep the socket 2054 from moving in an X-Y-Z direction on the surface of the substrate 2070 prior to reflow or application of some other SMT technology. In embodiments, the securing features 2057 may be removed after reflow, or may remain attached. In embodiments, the securing features 2057 may be used in conjunction with the carrier frame 1962 of FIG. 19A, and may be used in place of or in addition to the locking post 1966 of FIG. 19B.

FIG. 21 illustrates an example of a process for coupling a cap with a socket to flatten the socket, in accordance with embodiments. Embodiments of the process 2100 or various portions of the process 2100 may be performed using one or more techniques described with respect to FIGS. 1A-20.

At block 2102, the process may include coupling a cap with a top side of a socket, the socket to receive a chip, wherein the socket has the top side and a bottom side opposite the top side, wherein the top side of the socket includes a support feature to receive mechanical pressure from the cap, wherein the socket includes a locking mechanism to secure the cap to the socket, and wherein the cap includes a pressure feature to apply mechanical pressure to the support feature of the socket. In embodiments, the cap and socket may include socket 300 of FIG. 3, cap 402 and socket 420 of FIG. 4, cap 502 and socket 520 of FIG. 5, cap 602 and socket 620 of FIG. 6, cap 702 and socket 720 of FIG. 7, cap 802 and socket 820 of FIG. 8, cap 902 and socket 920 of FIG. 9, socket 1454 of FIG. 14, cap 1502 and socket 1554 of FIG. 15, socket 1654 of FIG. 16, socket 1754 of FIG. 17, cap 1802 and socket 1820 of FIG. 18, socket 1956 of FIGS. 19A-19D, and socket 2054 of FIG. 20. Additionally the cap may include the carrier frame 1962 of FIG. 19A.

The support feature of the top side of the socket may include standoff features 324 of FIG. 3, or various areas of the socket is shown throughout, for example area 1963 of FIG. 19A. The locking mechanism of the socket may include spaces 330 of FIG. 3, slot 530 and stop 520a of FIG. 5. The pressure feature of the cap may be seen in spring 510 of FIG. 5, spring 610 of FIG. 6, Spring 710 of FIG. 7, spring 810 of FIG. 8, and supporting structure 909 of FIG. 9.

At block 2104, the process may include securing the cap to the socket to engage the locking mechanism to secure the cap to the top side of the socket and to apply mechanical pressure to the support feature of the socket to alter a shape of the socket. In embodiments, securing may include implementing the latch 200a of FIG. 2A when securing the cap 402 into socket for 420 of FIG. 4. Embodiments may include securing the carrier tray 1962 to the substrate 1970 of FIG. 19C.

Figure 22:
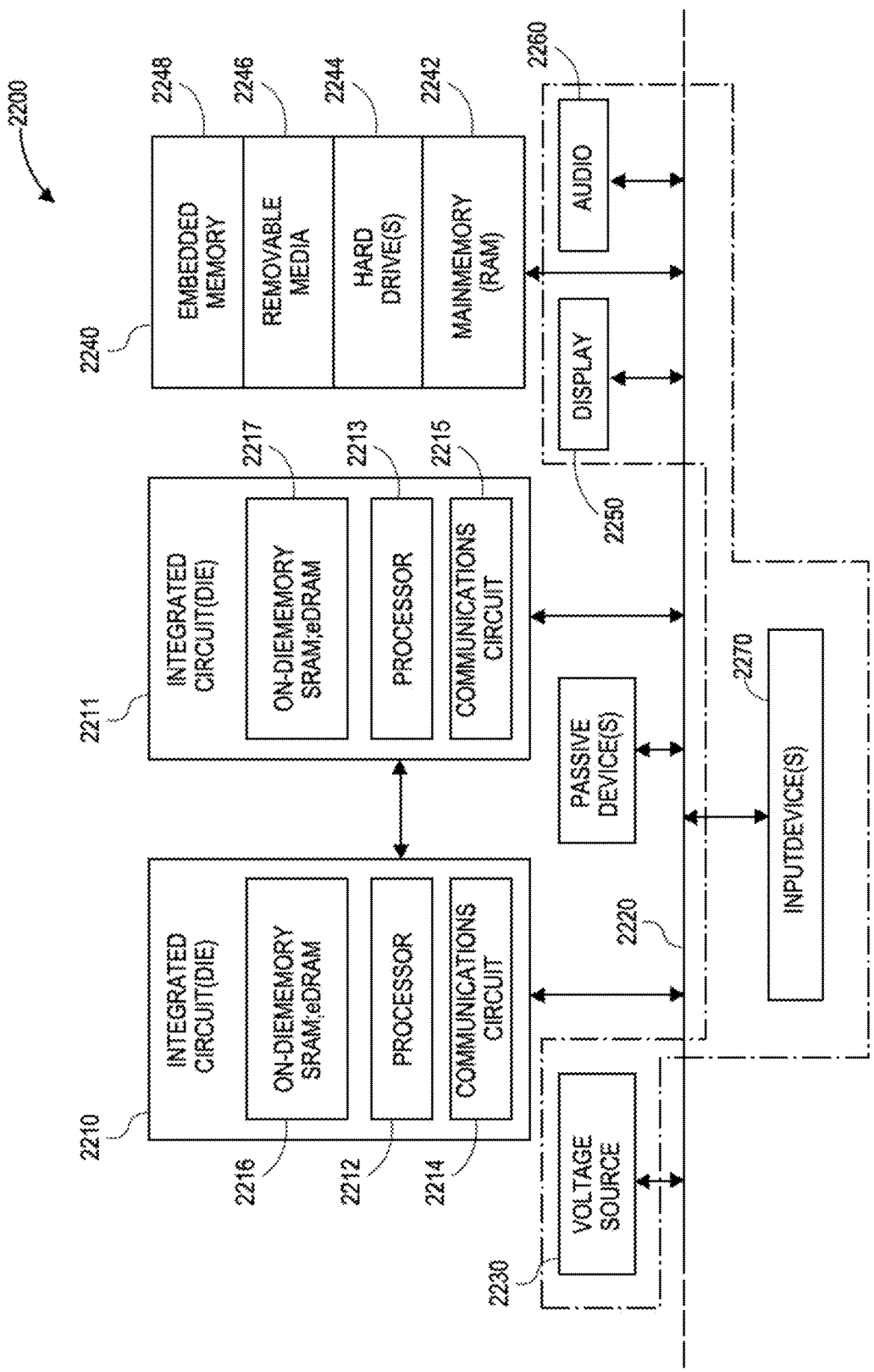
FIG. 22 schematically illustrates a computing device, in accordance with embodiments.

FIG. 22 schematically illustrates a computing device, in accordance with embodiments.

The computer system 2200 (also referred to as the electronic system 2200) as depicted can embody pressure features to alter the shape of a socket, according to any of the several disclosed embodiments and their equivalents as set forth in this disclosure. The computer system 2200 may be a mobile device such as a netbook computer. The computer system 2200 may be a mobile device such as a wireless smart phone. The computer system 2200 may be a desktop computer. The computer system 2200 may be a hand-held reader. The computer system 2200 may be a server system. The computer system 2200 may be a supercomputer or high-performance computing system.

In an embodiment, the electronic system 2200 is a computer system that includes a system bus 2220 to electrically couple the various components of the electronic system 2200. The system bus 2220 is a single bus or any combination of busses according to various embodiments. The electronic system 2200 includes a voltage source 2230 that provides power to the integrated circuit 2210. In some embodiments, the voltage source 2230 supplies current to the integrated circuit 2210 through the system bus 2220.

The integrated circuit 2210 is electrically coupled to the system bus 2220 and includes any circuit, or combination of circuits according to an embodiment. In an embodiment, the integrated circuit 2210 includes a processor 2212 that can be of any type. As used herein, the processor 2212 may mean any type of circuit such as, but not limited to, a microprocessor, a microcontroller, a graphics processor, a digital signal processor, or another processor. In an embodiment, the processor 2212 includes, or is coupled with, pressure features to alter the shape of a socket, as disclosed herein. In an embodiment, SRAM embodiments are found in memory caches of the processor. Other types of circuits that can be included in the integrated circuit 2210 are a custom circuit or an application-specific integrated circuit (ASIC), such as a communications circuit 2214 for use in wireless devices such as cellular telephones, smart phones, pagers, portable computers, two-way radios, and similar electronic systems, or a communications circuit for servers. In an embodiment, the integrated circuit 2210 includes on-die memory 2216 such as static random-access memory (SRAM). In an embodiment, the integrated circuit 2210 includes embedded on-die memory 2216 such as embedded dynamic random-access memory (eDRAM).

In an embodiment, the integrated circuit 2210 is complemented with a subsequent integrated circuit 2211. Useful embodiments include a dual processor 2213 and a dual communications circuit 2215 and dual on-die memory 2217 such as SRAM. In an embodiment, the dual integrated circuit 2210 includes embedded on-die memory 2217 such as eDRAM.

In an embodiment, the electronic system 2200 also includes an external memory 2240 that in turn may include one or more memory elements suitable to the particular application, such as a main memory 2242 in the form of RAM, one or more hard drives 2244, and/or one or more drives that handle removable media 2246, such as diskettes, compact disks (CDs), digital variable disks (DVDs), flash memory drives, and other removable media known in the art. The external memory 2240 may also be embedded memory 2248 such as the first die in a die stack, according to an embodiment.

In an embodiment, the electronic system 2200 also includes a display device 2250, an audio output 2260. In an embodiment, the electronic system 2200 includes an input device such as a controller 2270 that may be a keyboard, mouse, trackball, game controller, microphone, voice-recognition device, or any other input device that inputs information into the electronic system 2200. In an embodiment, an input device 2270 is a camera. In an embodiment, an input device 2270 is a digital sound recorder. In an embodiment, an input device 2270 is a camera and a digital sound recorder.

As shown herein, the integrated circuit 2210 can be implemented in a number of different embodiments, including a package substrate having pressure features to alter the shape of a socket, according to any of the several disclosed embodiments and their equivalents, an electronic system, a computer system, one or more methods of fabricating an integrated circuit, and one or more methods of fabricating an electronic assembly that includes a package substrate having pressure features to alter the shape of a socket, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having pressure features to alter the shape of a socket embodiments and their equivalents. A foundation substrate may be included, as represented by the dashed line of FIG. 22. Passive devices may also be included, as is also depicted in FIG. 22.

EXAMPLES

The following paragraphs describe examples of various embodiments.

Example 1 is an apparatus comprising: a socket with a top side and a bottom side opposite the top side, wherein the top side of the socket includes a support feature to receive mechanical pressure from a cap to be coupled with the socket, and wherein the socket includes a locking mechanism to secure the cap to the socket; and the cap coupled with the socket, wherein the cap includes a pressure feature to apply mechanical pressure to the support feature of the socket, wherein the cap is engaged with the locking mechanism of the socket to secure the cap to the socket to alter a shape of the bottom side of the socket.

Example 2 includes the apparatus of example 1, wherein the mechanical pressure is to flatten the bottom side of the socket.

Example 3 includes the apparatus of example 1, wherein the support feature of the top side of the socket includes one or more elevated surfaces.

Example 4 includes the apparatus of example 3, wherein the pressure feature includes one or more springs to apply mechanical pressure to the one or more elevated surfaces.

Example 5 includes the apparatus of example 3, wherein the one or more springs are a part of the cap.

Example 6 includes the apparatus of example 1, further including a chip physically and electrically coupled with the top side of the socket.

Example 7 includes the apparatus of example 1, wherein the cap further comprises a latch to be inserted into the locking mechanism of the socket when the cap is coupled with the socket.

Example 8 includes the apparatus of example 7, further comprising a cut out of a portion of the latch to be inserted into the socket, wherein the cut out is to lock with a feature of the locking mechanism.

Example 9 includes the apparatus of example 7, wherein the feature of the locking mechanism is to receive the cut out of the portion of the latch inserted into the socket.

Example 10 includes the apparatus of example 1, wherein the locking mechanism is on an outside edge of the socket.

Example 11 includes the apparatus of example 1, wherein the locking mechanism is on an outside edge of an internal opening of the socket passing through the top side and the bottom side of the socket.

Example 12 includes the apparatus of any one of examples 1-11, wherein the cap is a pick and place cap.

Example 13 is an apparatus, comprising: a plate having a first side and a second side opposite the first side; one or more load members coupled with and extending from the second side of the plate in a direction opposite the first side of the plate, the one or more load members positioned to apply a load at various locations of a first side of a socket that has a second side opposite the first side to alter a shape of the socket.

Example 14 includes the apparatus of example 13, wherein weight is to be applied to the first side of the plate to apply the load at the various locations of the first side of the socket.

Example 15 includes the apparatus of example 13, wherein the plate is a metal plate.

Example 16 includes the apparatus of example 13, wherein the apparatus is a pick and place cover.

Example 17 includes the apparatus of example 13, further including the socket.

Example 18 includes the apparatus of example 17, wherein the socket includes an electrical conductor passing from the first side of the socket through the second side of the socket; and wherein the electrical conductor extends beyond the second side of the socket and forms a J-lead to couple with a pad on a motherboard.

Example 19 includes the apparatus of any one of examples 13-18, further including the pad and the motherboard.

Example 20 includes the apparatus of example 19, wherein the electrical conductor is a plurality of electrical conductors passing, respectively, from the first side of the socket through the second side of the socket.

Example 21 is a method, comprising: coupling a cap with a top side of a socket, the socket to receive a chip, wherein the socket has the top side and a bottom side opposite the top side, wherein the top side of the socket includes a support feature to receive mechanical pressure from the cap, wherein the socket includes a locking mechanism to secure the cap to the socket, and wherein the cap includes a pressure feature to apply mechanical pressure to the support feature of the socket; and securing the cap to the socket to engage the locking mechanism to secure the cap to the top side of the socket and to apply mechanical pressure to the support feature of the socket to alter a shape of the socket.

Example 22 includes the method of example 21, wherein to alter the shape of the socket is to cause a plurality of electrical conductors on the second side of the socket to come into contact with a plurality of pads on the substrate.

Example 23 includes the method of example 21, further comprising applying a reflow to the surface of the substrate to secure the socket to the substrate.

Example 24 includes the method of any one of examples 21-23, further comprising, after applying the reflow, removing the cap from the socket.

Example 25 is an apparatus, comprising: a socket with a first side and a second side opposite the first side; an electrical conductor within the socket passing from the first side of the socket to the second side of the socket, wherein the electrical conductor extends beyond the second side of the socket and forms a J-lead to couple with a pad on a motherboard.

Example 26 includes the apparatus of example 25, wherein the electrical conductor is a plurality of electrical conductors passing, respectively, from the first side of the socket to the second side of the socket.

Example 27 includes the apparatus of any one of examples 25-26, further comprising a motherboard; wherein the J-lead is coupled with a pad on the motherboard; and wherein there is no solder ball tangent to the J-lead between the second side of the socket and the motherboard.

Example 28 is an apparatus, comprising: a carrier with a first side and a second side opposite the first side; an attachment mechanism coupled with the second side of the carrier to hold a socket having a first side and a second side opposite the first side, wherein the first side of the socket is at least partially tangent with the second side of the carrier.

Example 29 includes the apparatus of example 28, wherein the attachment mechanism does not extend beyond the second side of the socket when the socket is attached within the attachment mechanism.

Example 30 includes the apparatus of example 28, further including a plurality of posts coupled with and extending from the second side of the carrier in a direction perpendicular to a plane of the carrier to couple with a substrate.

Example 31 includes the apparatus of example 30, wherein ends of the posts opposite the carrier are to be inserted, respectively, within holes of the substrate to lock the carrier to the substrate and to physically couple the second side of the socket to the substrate.

Example 32 includes the apparatus of example 28, wherein the first side of the socket includes a contact array.

Example 33 includes the apparatus of any one of examples 28-32, wherein the apparatus includes a socket.

Example 34 is a method, comprising: coupling a socket with an attachment mechanism of a carrier, the socket having a first side and a second side opposite the first side, wherein the first side of the socket is at least partially tangent with the carrier; and coupling the carrier with the substrate, wherein the second side of the socket is tangent to the substrate and wherein the carrier applies a force to the socket against the substrate.

Example 35 includes the method of example 34, wherein coupling the carrier with the substrate further includes inserting posts of the carrier, respectively, into holes in the substrate.

Example 36 includes the method of example 35, wherein inserting posts of the carrier into holes in the substrate further include latching ends of the posts to the carrier.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
    a socket with a top side and a bottom side opposite the top side, wherein the top side of the socket includes a support feature to receive mechanical pressure from a cap to be coupled with the socket, and wherein the socket includes a locking mechanism of to secure the cap to the socket;
    the cap coupled with the socket, wherein the cap includes a pressure feature to apply mechanical pressure to the support feature of the socket, wherein the pressure feature of the cap comprises one or more springs, the spring is extending from the cap and wherein the cap is engaged with the locking mechanism of the socket to secure the cap to the socket to alter a shape of the bottom side of the socket.

2. The apparatus of claim 1, wherein the mechanical pressure is to flatten the bottom side of the socket.

3. The apparatus of claim 1, further including a chip physically and electrically coupled with the top side of the socket.

4. The apparatus of claim 1, wherein the locking mechanism is on an outside edge of the socket.

5. The apparatus of claim 1, wherein the locking mechanism is on an outside edge of an internal opening of the socket passing through the top side and the bottom side of the socket.

6. The apparatus of claim 1, wherein the cap is a pick and place cap.

7. The apparatus of claim 1, wherein the support feature of the top side of the socket includes one or more elevated surfaces.

8. The apparatus of claim 7, wherein the pressure feature includes the one or more springs to apply mechanical pressure to the one or more elevated surfaces.

9. The apparatus of claim 1, wherein the cap further comprises a latch to be inserted into the locking mechanism of the socket when the cap is coupled with the socket.

10. The apparatus of claim 9, further comprising a cut out of a portion of the latch to be inserted into the socket, wherein the cut out is to lock with a feature of the locking mechanism.

11. The apparatus of claim 9, wherein the feature of the locking mechanism is to receive the cut out of the portion of the latch inserted into the socket.

12. The method, comprising:
coupling a cap with a top side of a socket, the socket to receive a chip, wherein the socket has the top side and a bottom side opposite the top side, wherein the top side of the socket includes a support feature to receive mechanical pressure from the cap, wherein the socket includes a locking mechanism to secure the cap to the socket, wherein the cap includes a pressure feature to apply mechanical pressure to the support feature of the socket; and wherein the pressure feature of the cap comprises one or more springs, the spring is extending from the cap; and
securing the cap to the socket to engage the locking mechanism to secure the cap to the top side of the socket and to apply mechanical pressure to the support feature of the socket to alter a shape of the socket.

13. The method of claim 12, wherein to alter the shape of the socket is to cause a plurality of electrical conductors on the second side of the socket to come into contact with a plurality of pads on the substrate.

14. The method of claim 12, further comprising applying a reflow to the surface of the substrate to secure the socket to the substrate.

15. The method of claim 12, further comprising, after applying the reflow, removing the cap from the socket.

16. The apparatus, comprising:
a socket with a first side and a second side opposite the first side;
an electrical conductor within the socket passing from the first side of the socket to the second side of the socket, wherein the electrical conductor extends beyond the second side of the socket and forms a J-lead to couple with a pad on a motherboard; and
a cap engaged with the locking mechanism of the socket to secure the cap to the socket to alter a shape of the socket, wherein the pressure feature of the cap comprises one or more springs, the spring is extending from the cap.

17. The apparatus of claim 16, wherein the electrical conductor is a plurality of electrical conductors passing, respectively, from the first side of the socket to the second side of the socket.

\* \* \* \* \*